(12) United States Patent
Yokoyama

(10) Patent No.: US 6,788,717 B2
(45) Date of Patent: Sep. 7, 2004

(54) WAVELENGTH STABILIZED LASER MODULE

(75) Inventor: Yoshitaka Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 76 days.

(21) Appl. No.: 09/804,499

(22) Filed: Mar. 12, 2001

(65) Prior Publication Data
US 2001/0022793 A1 Sep. 20, 2001

(30) Foreign Application Priority Data
Mar. 10, 2000 (JP) ........................... 2000-067606

(51) Int. Cl.[7] .............................. H01S 3/10; H01S 3/00
(52) U.S. Cl. .................. 372/29.01; 372/32; 372/34; 372/36; 372/38.1; 372/38.01; 372/38.02; 372/29.011; 372/29.02; 356/452; 356/454; 356/460; 356/506
(58) Field of Search .................. 372/29.02, 32, 372/34, 36, 38.1, 38.02, 29.011, 26, 96, 38.01; 356/452, 454, 460, 506

(56) References Cited

U.S. PATENT DOCUMENTS

| | | | |
|---|---|---|---|
| 4,821,273 A | | 4/1989 | Hori |
| 5,025,449 A | * | 6/1991 | Yamamoto et al. ........... 372/32 |
| 5,216,237 A | | 6/1993 | Ritchie et al. |
| 5,390,203 A | * | 2/1995 | Miller ......................... 372/29 |
| 5,446,750 A | * | 8/1995 | Ohtsuka et al. ............... 372/34 |
| 5,760,419 A | | 6/1998 | Nabiev et al. |
| 6,018,536 A | * | 1/2000 | Alphonse ..................... 372/23 |
| 6,233,263 B1 | * | 5/2001 | Chang-Hasmain et al. ... 372/23 |
| 6,301,280 B1 | * | 10/2001 | Broutin et al. ........... 372/38.01 |
| 6,389,046 B1 | * | 5/2002 | Stayt, Jr. et al. ......... 372/29.02 |

FOREIGN PATENT DOCUMENTS

| | | |
|---|---|---|
| EP | 0 390 525 A2 | 10/1990 |
| EP | 0 818 857 A1 | 1/1998 |
| JP | 56-55087 | 5/1981 |
| JP | 58 056539 A | 4/1983 |
| JP | 62-244184 | 10/1987 |

(List continued on next page.)

OTHER PUBLICATIONS

T. Nieml, et al.: "Temperature–Tunable Silicon–Wafer Etalon for Frequency Chirp Measurements", Microwave and Optical Technology Letters, John Wiley & Sons, Inc., NY, NY, US, vol. 20, No. 3, Feb. 5, 1999, pp. 190–192; ISSN: 0895–2477/99.

Microwave and Optical Technology Letters; vol. 20, No. 3, Feb. 5, 1999, pp. 190–192.

Primary Examiner—Tom Thomas
Assistant Examiner—Joseph Nguyen
(74) Attorney, Agent, or Firm—Choate, Hall & Stewart

(57) ABSTRACT

A wavelength stabilized laser module is provided which is so configured as to be simplified and smaller in size and is capable of emitting semiconductor laser light whose wavelength is stablized with high accuracy. The wavelength stablized laser module includes a semiconductor laser, a substrate, a lens to convert emitted semiconductor laser light to parallel luminous flux, a first photoelectric converter to receive a part of the parallel luminous flux and to convert it to electric signals, a filter to receive a part of the parallel luminous flux, a second photoelectric converter to receive light transmitted through the filter and to convert it to electric signals, wherein a control signal to be used for stabilization obtained by computations of electric signals fed from the converters is fed back to the semiconductor laser device and/or the substrate so that said semiconductor laser is able to stably emit laser light having a reference wavelength to be used as a target for stabilization.

20 Claims, 14 Drawing Sheets

FOREIGN PATENT DOCUMENTS

| | | |
|---|---|---|
| JP | 2-77630 | 3/1990 |
| JP | 2-254777 | 10/1990 |
| JP | 5-243664 | 9/1993 |
| JP | 6-281812 | 10/1994 |
| JP | 6-326382 | 11/1994 |
| JP | 9-121070 | 5/1997 |
| JP | 9-219554 | 8/1997 |
| JP | 10-79551 | 3/1998 |
| JP | 10-79723 | 3/1998 |
| JP | 2914748 | 4/1999 |
| JP | 11-122176 | 4/1999 |
| JP | 2989775 | 10/1999 |
| JP | 11-354887 | 12/1999 |
| JP | 2000-12968 | 1/2000 |
| JP | 2000-22259 | 1/2000 |
| JP | 2000 56185 A | 2/2000 |
| JP | 2001-291928 | 10/2001 |
| JP | 2001-524762 | 12/2001 |
| WO | PCT/US98/25142 | 11/1998 |

* cited by examiner

33;filter
41;filter-integrated optical detector

34;filter
42;optical detector

11; optical modulator integrated semiconductor unit
3; filter

12; semiconductor laser
35; etalon-type filter

36; etalon-type filter

WAVELENGTH STABILIZED LASER MODULE

BACKGROUND OF THE INVENTION

1. Field of the Invention

The present invention relates to a wavelength stabilized laser module and more particularly to the wavelength stabilized laser module capable of emitting laser light whose wavelength is stabilized with high accuracy and of being so configured as to be simple in structure and being made smaller in size.

The present application claims priority of Japanese Patent Application No.2000-067606 filed on Mar. 10, 2000, which is hereby incorporated by reference.

2. Description of the Related Art

Conventionally, a semiconductor laser device is used as an optical source for optical fiber communication. A single axial mode semiconductor laser such as a DFB (Distributed FeedBack laser) laser is employed, in particular, for optical fiber communication over distances of tens of kilometers or more in order to prevent an adverse effect on chromatic dispersion. However, though the DFB laser oscillates at a single wavelength, its oscillation wavelength is changed depending on a temperature of the semiconductor laser device and/or an injected current. Moreover, in the optical fiber communication system, since it is important to keep output strength of a semiconductor laser light source at a constant level, control is conventionally exercised so as to keep the temperature of the semiconductor laser device and the output strength of the semiconductor laser light source at the constant level. Basically, by keeping the temperature of the semiconductor laser device and the injected current at the constant level, a light output and oscillation wavelength of the semiconductor laser device can remain constant. However, if the semiconductor laser device is degraded due to longtime use, the injected current required for keeping the light output at the constant level increases, as a result, causing the oscillation wavelength to change. However, since changed amounts of the oscillation wavelength are slight, substantially no problem has occurred in the conventional optical fiber communication system.

In recent years, a DWDM (Dense Wavelength Division Multiplexing) method in which multiple pieces of light each having a different wavelength are multiplexed in one optical fiber becomes mainstream in the conventional optical fiber communication system and an interval among a plurality of the oscillation wavelengths used for the DWDM system becomes as narrow as 100 GHz or 50 GHz. In this case, a degree of wavelength stabilization required for the semiconductor laser device being used as the light source is, for example, ±50 pm, which means that conventional method in which temperatures of the semiconductor laser device and outputs of the semiconductor laser light are controlled so as to be kept at the constant level is not sufficient to obtain the required degree of wavelength stabilization. Moreover, even if the temperature of the semiconductor laser itself can be successfully controlled so as to remain constant, every time an ambient temperature surrounding the semiconductor laser device changes, the oscillation wavelength is also changed slightly and cases are increasing in which such a slight change in the oscillation wavelength causes a problem in the recent conventional optical fiber communication system.

In order to prevent such changes in the oscillation wavelength of the semiconductor laser light and to stabilize the oscillation wavelength, some conventional methods for stabilization have been proposed. A first example of the conventional wavelength stabilizing device (hereinafter being referred to as a first conventional example) is disclosed in, for example, Japanese Patent No. 2989775 (JP. Appln. Laid-open No. Hei 10-209546, in which, as shown in FIG. 19, a wavelength stabilizing device 128 is housed in a case mounted separately from a semiconductor laser module. A part of laser light is branched through a coupler 109 from an optical fiber transmission path 108 and introduced into the wavelength stabilizing device 128. In the wavelength stabilizing device 128, a filter 103 serving as a band pass filter is embedded, and an optical detector 111 used to detect light transmitted through the filter 103 and an optical detector 110 used to detect light reflected off the filter 103 are placed opposite to each other. FIG. 20 is a diagram showing optical current spectra to explain operations of the wavelength stabilizing device 128. As shown in FIG. 20, the transmitted light detected by the optical detector 111 and the reflected light detected by the optical detector 110 are in opposite phase relative to the oscillation wavelength of the semiconductor laser light. By calibrating the filter 103 and the optical detectors 110 and 111 so that a point of intersection of the reflected light and transmitted light, which is indicated by an arrow in FIG. 20, becomes a targeted wavelength for stabilization and by feeding back the transmitted light and reflected light to a temperature controlling unit (not shown) attached to the semiconductor laser device so that the transmitted light and reflected light become equal in light strength, the stabilization of oscillation wavelength of the semiconductor laser is achieved. Moreover, a slide adjusting unit 112 to set a reference wavelength to be used as a target for the stabilization is mounted on the filter 103.

The conventional wavelength stabilizing device 128 has problems in that, since it is basically housed in the case mounted separately from the semiconductor laser module, additional space for its installation is required, thus causing an increase in costs. Moreover, since a part of the signal light is branched by the coupler 109, the branched light is attenuated. Though the targeted reference wavelength can be set only by adjusting a position of the filter 103 using the slide adjusting unit 112, a specially-fabricated expensive filter is required which is so worked as to change its transmission characteristics in a direction of its plane by gradually changing internal thickness of the filter. Furthermore, since transmission characteristics of a filter, in general, are changed depending on a temperature of the filter itself, a separate process of adjusting the temperature of the filter 103 or a special electric circuit that can compensate for changes in transmission characteristics caused by the temperature is required.

A second example of the conventional wavelength stabilizing device adapted to prevent changes in an oscillation wavelength of a semiconductor laser light and to stabilize its wavelength is disclosed in Japanese Patent No. 2914748 (JP. Appln. Laid-open No. Hei 4-157780, which is shown in FIG. 21. A basic principle of stabilizing the wavelength in this wavelength stabilizing device is the same as provided in the first conventional example; that is, a part of signal light is branched and incident on a filter 103, and reflected light and transmitted light from the filter 103 are detected by the optical detectors 110 and 111 respectively, which are then fed back to the temperature controlling unit (not shown) of the semiconductor laser. The second conventional example differs from the first conventional example in that a frequency setting section 113 is provided, which is used to adjust an angle of the filter 103.

However, there is a problem in that, when the angle of the filter 103 is adjusted, since a direction of the reflected light from the filter 103 is also changed, a position of the optical detector 110 used to detect the reflected light has to be adjusted accordingly. In the second conventional example, though a method for adjusting a temperature of the filter 103, method for changing an electro-optic effect of the filter 103 or a like are also disclosed, it is actually difficult to put these methods to practical use.

A third example of the conventional wavelength stabilizing device adapted to prevent changes in an oscillation wavelength of a semiconductor laser and to stabilize its wavelength is disclosed in Japanese Patent Application Laid-open No. Hei 9-219554, which is shown in FIG. 22. This wavelength stabilizing device differs from the first and second conventional wavelength stabilizing devices in that light emitted from a semiconductor laser module 101 is branched by a beam splitter 115 having no dependence on a wavelength of light and each piece of the branched light is received by optical detectors 110 and 111 respectively and that a filter 117 whose transmittance becomes low with decreasing wavelength of light is mounted in front of the optical detector 110 and a filter 116 whose transmittance becomes high with increasing wavelength of light is mounted in front of the optical detector 111. As a result, as in the cases of the first and second conventional examples, by adjusting a balance of signals fed from the two optical detectors 110 and 111, the wavelength of light emitted from the semiconductor laser module 101 can be stabilized. In this method, though units adapted to adjust angles of the filters 116 and 117 for matching of the wavelength are required, since transmitted light is incident on both the filters 116 and 117, there is no need for adjusting positions of the optical detectors 110 and 111 when the angles of the filters 116 and 117 are adjusted.

However, it is actually impossible to house so many components including the beam splitter 115, the filter 117 and the detector 110 to be mounted in a vertical direction to an optical axis of the laser oscillation light in a tightly-spaced case of the semiconductor laser module 101. Moreover, it is also difficult to obtain a sufficient quantity of light transmitted through the filter 117 to stabilize the wavelength of the laser light unless an optical system is used which is adapted to cause light emitted from the semiconductor laser module 101 to converge to be parallel luminous flux, with aid of a lens or a like. This is because, since the semiconductor laser module 101 emits light at a relatively large radiation angle, as a distance between a surface from which the semiconductor laser is radiated and optical detectors 110 and 111 becomes far, strength of detection of the light is rapidly decreased. As shown in FIG. 23, if a light receiving area of an optical detector 104 is made large in order to increase its detecting sensitivity, an area of the filter 103 on which light is incident also increases and a big difference in an angle of incidence on the filter 103 occurs due to positional reasons. That is, a difference in the angle of incidence between rays A and B becomes large. Since the wavelength filter used in the example has a property in which its transmission characteristic depends greatly on the incident angle of light, regardless of whether the filter is of a multilayer type or of an etalon type, as is the case of the multilayer type shown in FIG. 24, there is a big difference in transmission characteristics between the rays A and B each having a big difference in the angle of incidence of light on the filter 103 and, as a result, in some cases, the dependence on wavelength in light receiving strength of the entire emitted laser becomes small or disappears. To avoid this problem, it is necessary to cause light emitted from the semiconductor laser module 101 to converge to be parallel luminous flux. However, in this case, component counts increase and adjustment of parts including the lens used to cause the light to converge to the parallel luminous flux, filters 116 and 117, beam splitter 115, optical detectors 110 and 111 or the like becomes complicated, thus causing an increase in manufacturing costs.

A fourth example of the conventional wavelength stabilizing device adapted to prevent changes in an oscillation wavelength of a semiconductor laser and to stabilize its wavelength is disclosed in Japanese Patent Application Laid-open No. Hei 10-79723, which is shown in FIG. 25. In the disclosed wavelength stabilizing device, in order to obtain a signal whose transmittance becomes high with increasing wavelength and a signal whose transmittance becomes low with decreasing wavelength, light emitted from a semiconductor laser module 101 is adjusted by using a lens 102 so as to be emitted at a specified diffusion angle and the diffused light is then incident on a tilt filter 103a and the light transmitted through the tilt filter 103a is detected by an optical detector 104 having two light receiving planes 105 and 106. Since light to be incident on the light receiving planes 105 and light to be incident on the light receiving planes 106 differ from each other in incident angles on the tilt filter 103a, with only the one tilt filter 103a, plural different transmission characteristics can be provided.

However, in the fourth conventional example, precise adjustment of optical systems employed in the wavelength stabilizing device is required and characteristics of light transmitted through the tilt filter 103a occurring when the light is incident on light receiving planes 105 and 106 are changed intricately due to changes in a diffusion angle of semiconductor laser light caused by an even slight change of a position of the lens 102, a change in an angle of the tilt filter 103a, a change in a position of the optical detector 104 or a like. That is, to independently control the tilt filter 103a transmitting characteristic affecting the incidence of the light on the light receiving planes 105 and 106 and to stabilize the wavelength so as to have a specified wavelength, highly accurate placement of each of parts making up the wavelength stabilizing device is required. For example, since it is impossible to stabilize the wavelength only by adjusting the angle of the tilt filter 103a, a big problem occurs when the wavelength stabilizing device is actually fabricated.

A fifth example of the conventional wavelength stabilizing device adapted to prevent changes in an oscillation wavelength of a semiconductor laser and to stabilize its wavelength is disclosed in Japanese Patent Application Laid-open No. Hei 9-121070, which is shown in FIG. 26. In the disclosed wavelength stabilizing device, backward emitted light from a semiconductor laser module 101 is branched by a beam splitter 115 and one branched light beam is incident directly on an optical detector 110 without being incident through a filter 103, which is used for detection of optical strength of the light, while another branched light beam is incident on an optical detector 111 through the filter 103, which is used for detection of a wavelength of the light. In this case, by controlling the optical detector 110 used to detect light not passing through the filter 103 so that its optical current is made constant, an output from the semiconductor laser module 101 can be controlled so as to remain constant. In the case of the light transmitted through the filter 103, as is understood from dependence of transmittance of the filter 103 on wavelengths, that is, dependence of an optical current "I" of the optical detector 111 on the wavelength as shown in FIG. 5, by stabilizing the output current used as a signal for the detection of the wavelength so as to become a constant value "$I_0$", the output of the light and its oscillation wavelength can be simultaneously controlled.

However, it is actually difficult to embed optical systems required for stabilizing a wavelength of laser light including the beam splitter 115 together with optical systems required for the semiconductor laser module 101 into a tightly-spaced case. Moreover, as in the case of the third conventional example, unless the optical system that can cause light emitted from the semiconductor laser module 101 to converge to be a parallel luminous flux is used, sufficient light transmitted through the filter 103 cannot be obtained. As a result, it is necessary to use a lens as an additional optical system, thus further increasing component counts. Placement and arrangement of each of components including lens, filter, and beam splitter are made complicated, causing an increase in manufacturing costs.

As described above, in the conventional wavelength stabilizing device for the semiconductor laser device, component counts are large and big space are required and therefore it is difficult to house all these components into the limited and tightly-spaced case for the semiconductor laser device module. Nevertheless, in the conventional wavelength stabilizing device, as in the case of the third example, unless optical systems by which semiconductor laser light is converged to be parallel luminous flux, filter emitted light that can satisfactorily achieve the stabilization of the wavelength can not be obtained. If the lens is incorporated in the optical system, component counts increase and further the adjustment of such components as the lens, filter, beam splitter, detectors or the like becomes complicated, leading to increased manufacturing costs.

As described above, in the conventional wavelength stabilizing devices of the semiconductor laser, component counts are very large which causes an increase in the required space and therefore it is not only difficult to house such conventional wavelength stabilizing devices into the case used for the conventional semiconductor laser module but also difficult to set the reference wavelength to be used as a target for the stabilization.

SUMMARY OF THE INVENTION

In view of the above, it is an object of the present invention to provide a wavelength stabilized laser module having small component counts and being compact enough to be housed in such a tightly-spaced case for a semiconductor laser module as has been conventionally used and being capable of setting a reference wavelength very easily with high accuracy and being manufactured at low costs.

According to a first aspect of the present invention, there is provided a wavelength stabilized laser module including:

a semiconductor laser;

a temperature calibrating unit to calibrate a temperature of the semiconductor laser;

a converting unit to convert light emitted from the semiconductor laser to parallel luminous flux;

a first photoelectric converting unit to receive a part of the parallel luminous flux and to convert it to an electric signal;

a filter to receive a part of the parallel luminous flux and to continuously change its transmittance depending on wavelengths of the parallel luminous flux;

a second photoelectric converting unit to receive light transmitted through the filter and to convert it to an electric signal; and wherein a control signal, to be used for stabilization, obtained by computations of the electric signal fed from the first photoelectric converting unit and the second photoelectric converting unit, is fed back to the semiconductor laser and/or the temperature calibrating unit so that the semiconductor laser is able to stably emit laser light having a reference wavelength to be used as a target for stabilization of wavelength.

With the above configuration, since one part of the luminous flux which is emitted from the semiconductor laser and is converted to the parallel luminous flux is received by the first photoelectric converting unit and another part of the luminous flux, after having been transmitted through the filter adapted to continuously change transmittance depending on wavelengths, is received by the second photoelectric converting unit, the first photoelectric converting unit can take out optical currents that change depending on an optical output from the semiconductor laser and the second converting unit can take out optical currents that change depending on an optical output fed from the semiconductor laser and depending on wavelengths. Therefore, by performing computations of the two optical currents taken from the wavelength stabilized laser module, each of a current value that changes depending on the optical output and a current value that changes depending on wavelengths can be independently obtained. Since, in the filter, a relationship between the wavelength and transmittance is clear, by comparing the current value that changes depending on wavelengths presently detected with the current value that is output according to the reference wavelength to be used as the target for stabilization of wavelengths, a shift between the wavelength of light presently emitted from the semiconductor laser and the reference wavelength can be calculated. Moreover, since a wavelength of semiconductor laser light generally changes depending on an injected current and a temperature of the semiconductor device, by feeding back the control signal to cause the shifted amount to be zero to the injected current adjusting device and the temperature calibrating unit of the semiconductor laser, variations in wavelengths of the semiconductor laser light can be reduced and laser light with the reference wavelength being stabilized with high accuracy can be emitted. Variations in optical outputs from the semiconductor laser have been detected by the first photoelectric converting unit, by feeding back the output shifted signal to the semiconductor laser, optical outputs from the semiconductor laser are stabilized with high accuracy. Furthermore, since parts such the beam splitter as has been used conventionally are not employed to obtain a signal that changes depending on the wavelength and a signal that does not change depending on the wavelength, component counts can be reduced and the space usage efficiency is made higher, thus enabling configurations of the wavelength stabilized laser module to be compact enough to be housed in such the tightly-spaced case as has been used for the conventional semiconductor laser module and, since the adjustment and assembly at a time of manufacturing of the module are made simpler due to reduced component counts, manufacturing costs are greatly reduced.

In the foregoing, a preferable mode is one wherein the first photoelectric converting unit and second photoelectric converting unit are so configured as to receive backward emitted light from the semiconductor laser.

With the above configuration, since all amounts of forward emitted light from the semiconductor laser can be utilized fully for optical communication, unlike the conventional examples, no loss of transmitted light power caused by branching of a part of the laser light from the optical transmission path that has been required for detection of wavelengths occurs.

Also, a preferable mode is one wherein the converting unit to convert light emitted from the semiconductor laser to parallel luminous flux is a lens and wherein one part of the single parallel luminous flux transmitted through the lens is incident on the first photoelectric converting unit and another part of the parallel flux is incident on the filter.

With the above configuration, by converting diffused light emitted from the semiconductor laser to the parallel luminous flux using the lens and by inserting the filter into a part of cross faces of the single parallel luminous flux transmitted through the lens so that one part of the parallel luminous flux is incident on the filter and another part of the parallel luminous flux is incident on the first photoelectric converting unit, adverse effects on transmission characteristics caused by differences in incident angles of light into the filter by places of light incidence can be prevented, thus enabling the stabilization of wavelengths with high accuracy and further inhibiting a decrease in light receiving strength, caused by the diffusion of laser light, in the first and second photoelectric converting units. Moreover, there is no need for mounting a lens separately for each of the first and second photoelectric converting units, thus serving to reduce component counts and to achieve the compact wavelength stabilized laser module.

Also, a preferable mode is one wherein a degree of parallelization of the parallel luminous flux is within ±2°.

With the above configuration, adverse effects on the transmission characteristics caused by differences in incident angles by portions of the filter can be minimized, thus achieving the highly accurate stabilization of wavelengths.

Also, a preferable mode is one wherein the filter has a transmission characteristic in which transmittance of the filter becomes high or low monotonically depending on wavelengths within a band of wavelengths containing the reference wavelength.

With the above configuration, by selecting the filter whose gradient of the transmission spectrum monotonically becomes high or low, the second photoelectric converting unit can immediately detect the wavelength of the laser light that changes on a long wavelength side or a short wavelength side relative to the reference wavelength, as a change on a bright side or a dark side of the light transmitted through the filter.

Also, a preferable mode is one wherein the filter is able to change, by adjusting an angle of incidence, a gradient of changes in transmittance which changes depending on wavelengths.

With the above configuration, if the gradient in changes in transmittance that changes depending on the wavelength can be varied by adjusting the angle of incidence, by making the gradient sharp, detecting sensitivity to changes in wavelengths can be improved and the stabilization of wavelengths with high accuracy is made possible, while, by making the gradient gentle, a band width of wavelength in which changes are detected can be expanded.

Also, a preferable mode is one wherein the filter has a unimodal transmission characteristic in which transmittance of the filter becomes maximum and minimum in a band of wavelengths not containing the reference wavelength.

With the above configuration, if the reference wavelength is in a maximum transmission band or in a minimum transmission band of the transmission characteristic, the sensitivity to changes in the wavelengths is greatly lowered. When the transmission characteristic is unimodal, in a wide band of wavelengths except the maximum transmission band or the minimum transmission band being limited bands, detection of wavelengths with high sensitivity is made possible.

Also, a preferable mode is one wherein the filter is a multilayer filter made up of dielectric multilayers formed on a transparent substrate.

With the above configuration, when the multilayer filter is used, a thickness of a glass substrate can be set arbitrarily, thus enabling the substrate to be thin and achieving the compact wavelength stabilized laser module.

Also, a preferable mode is one wherein the filter is an etalon-type filter exhibiting a transmittance period in which transmittance of the filter becomes maximum and minimum repeatedly at an interval of a specified wavelength.

With the above configuration, since the etalon-type filter has a plurality of maximum points and minimum points within a band of wavelengths of light that can be emitted from the semiconductor laser, each of the reference wavelengths can be set to be placed on the gradient of the spectrum between each of the maximum points and each of the minimum points and stabilization of the plurality of the reference wavelengths can be achieved in the multiple optical system using, as the light source, the wavelength tunable semiconductor laser in the single wavelength stabilized laser module.

Also, a preferable mode is one wherein the semiconductor laser is a wavelength tunable semiconductor laser that is able to emit light having the plurality of wavelengths which change depending on temperatures and the interval of wavelengths in the transmittance period of the etalon-type filter is set by an equation:

$$D=(1-T_{etalon}/T_{LD}) \times D_0 \qquad (1)$$

where "D" represents the wavelength interval in the transmittance period of the etalon-type filter, "$D_0$" represents an interval of the plurality of wavelengths of light emitted from the semiconductor laser, "$T_{etalon}$" represents an amount of a change in a central wavelength occurring when a temperature of the etalon-type filter changes by 1° C. and "$T_{LD}$" represents an amount of a change in an oscillation wavelength occurring when a temperature of the semiconductor laser changes by 1° C., however, the central wavelength represents one wavelength that causes the transmittance to be maximum.

With the above configuration, when the wavelength interval of the transmittance period of the etalon-type filter obtained by the above equation is set by using the semiconductor laser that can change the wavelength depending on temperatures, the plurality of reference wavelengths can be set to be placed on the gradient of the spectrum between the maximum point and the minimum point of the transmittance period, thus serving to the stabilization of each of wavelengths of light emitted from the semiconductor laser in the single wavelength stabilized laser module.

Also, a preferable mode is one wherein the filter is made up of a transparent material having reflectivity being higher than that of silica glass.

Also, a preferable mode is one wherein the transparent material is a Si (Silicon)-based material.

With the above configurations, by using the transparent base material having high reflectivity as the material for the etalon-type filter or multilayer filter rather than the silica glass that has been conventionally used, a thickness of the filter can be made thin and the space required for mounting the wavelength stabilized laser module can be further reduced. The Si-based material is transparent and has reflectivity being higher than that of the silica glass and is the relatively low-cost material widely used in the semiconductor fields and therefore it is best suitable as the material for the filter of the present invention.

Also, a preferable mode is one wherein the filter is fixed to the second photoelectric converting unit.

Also, a preferable mode is one wherein the filter is formed on a light receiving surface of the second photoelectric converting unit by a coating method.

With the above configurations, by mounting the filter and the photoelectric converting unit in an integral manner, more compact configurations of the wavelength stabilized laser module can be achieved, when compared with the case in which these components are mounted in a separate manner.

Also, a preferable mode is one wherein the first and second photoelectric units are placed in parallel on a holding substrate and make up an array-shaped optical detector.

With the above configuration, since complicated adjustment of angle is not required, by using these converting units as part of the optical detector with these converting units mounted in parallel, component counts and man-hours needed to assemble can be reduced, thus serving to lower manufacturing costs.

Also, a preferable mode is one wherein a light receiving surface of the first photoelectric converting unit is placed in a tilt manner relative to an optical axis of incident light.

With the above configuration, feedback light by reflection which is reflected off the light receiving surface of the first photoelectric converting unit toward the semiconductor laser can be removed, thus reducing changes in the oscillation characteristics of the semiconductor laser caused by the feedback light.

Also, a preferable mode is one wherein the semiconductor laser has a configuration of a device integrated with an electroabsorption-type semiconductor optical modulator.

With the above configuration, since the semiconductor laser is integral with the electroabsorption-type semiconductor optical modulator, when compared with the case in which each of the DFB laser and the outside modulator is mounted as a separate module, it is possible to make the entire optical transmission system compact.

Also, a preferable mode is one wherein the temperature calibrating unit is a Peltier device.

With the above configuration, since the Peltier device can set a temperature accurately within an arbitrary range of temperatures under electronic control and the Peltier device can be configured to be thin, it can be housed in the case as an integral part of the module substrate.

Furthermore, a preferable mode is one that wherein includes an optical fiber used as a device through which laser light is output and a single case housing, at least, the semiconductor laser, the temperature calibrating unit, the converting unit for conversion to parallel luminous flux, the filter and the first and second photoelectric converting units.

With the above configuration, since component counts of the wavelength stabilizing device are small and its adjustment is made easy, it can be housed in such the small-sized case as has been conventionally used for housing the semiconductor laser module with no wavelength stabilizing device.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
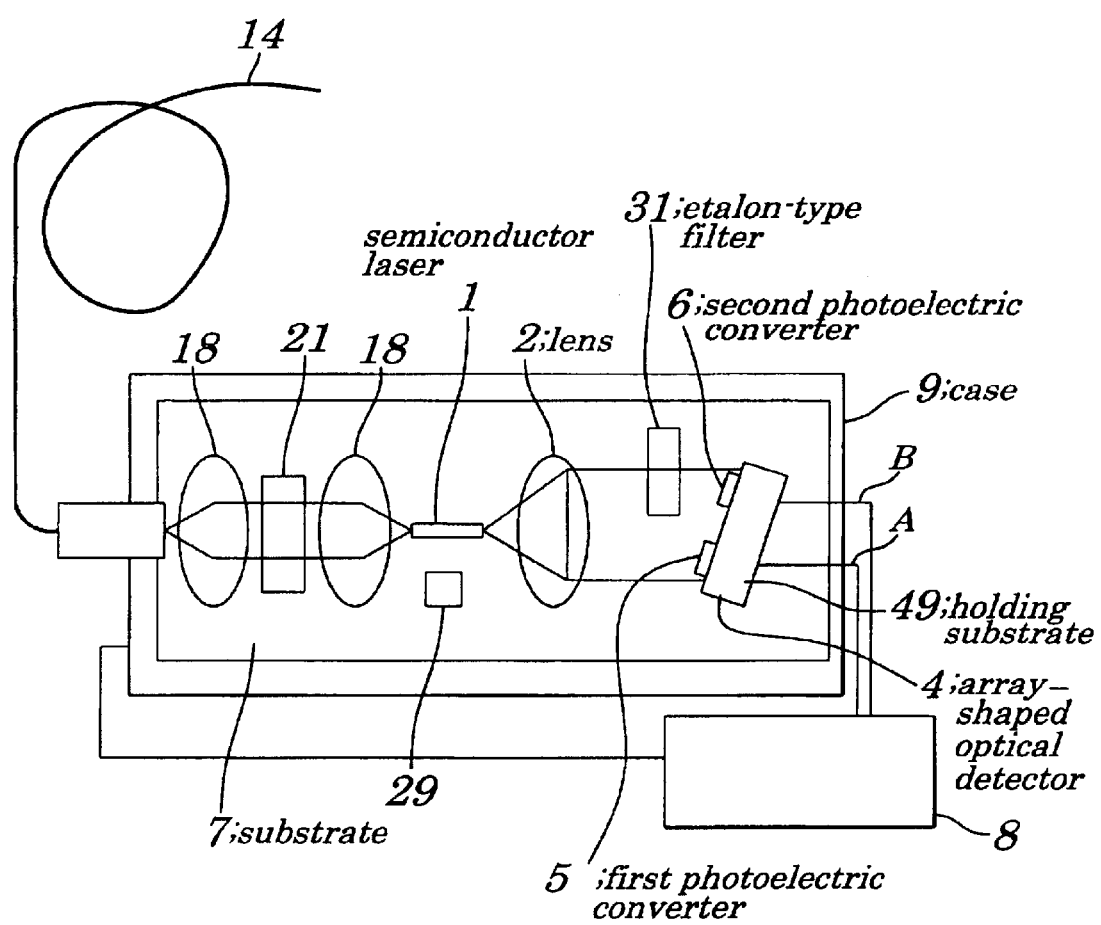
FIG. 1 is a schematic block diagram showing configurations of a wavelength stabilized laser module of a first embodiment of the present invention.
Figure 2:
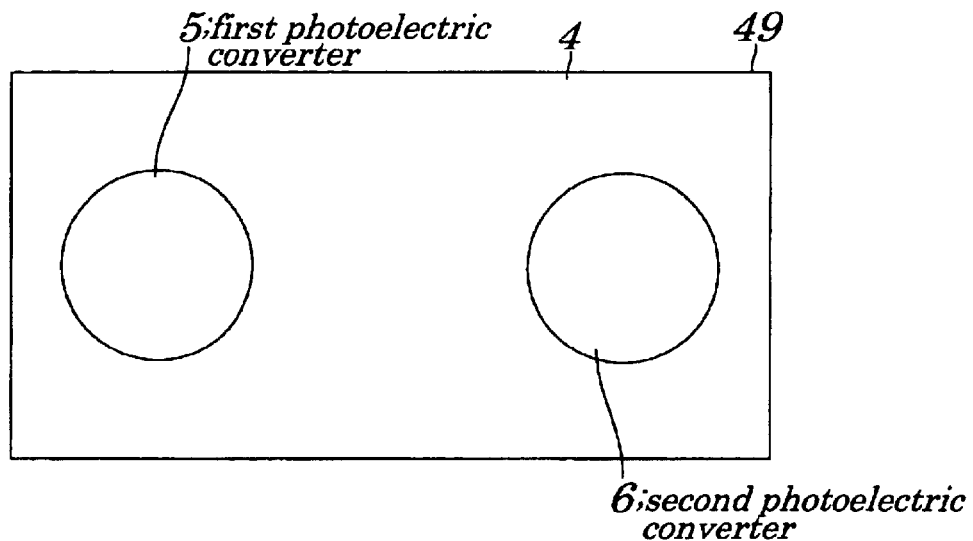
FIG. 2 is a top view of an optical detector employed in the wavelength stabilized laser module of the first embodiment of the present invention.

FIG. 1 is a schematic block diagram showing configurations of a wavelength stabilized laser module of a first embodiment of the present invention. The wavelength stabilized laser module of the first embodiment includes a case 9, a semiconductor laser 1, a lens 2 used to convert backward emitted light radiated from the semiconductor laser 1 in a diffused manner to parallel luminous flux, a first photoelectric converter 5 used to directly receive a part of the parallel luminous flux transmitted through the lens 2 and to convert it to an electric signal, an etalon-type filter 31 to receive a part of the parallel luminous flux transmitted through the lens 2 and a second photoelectric converter 6 to receive light transmitted through the etalon-type filter 31 and to convert it to an electric signal. The semiconductor laser 1 is mounted on a substrate 7 having a Peltier device (not shown) and the substrate 7 is so constructed that a temperature of the semiconductor laser is adjustable by the Peltier device while the semiconductor laser 1 is being operated. The etalon-type filter 31 is so configured that an angle of incidence of light can be calibrated by an angle calibrating mechanism (not shown). The first photoelectric converter 5 and the second photoelectric converter 6 are mounted in parallel on a holding substrate 49, making up an array-shaped optical detector 4. The array-shaped optical detector 4 is placed in a tilt manner relative to an optical axis of incident light to prevent feedback light reflected toward the semiconductor laser 1.

In the wavelength stabilized laser module of the embodiment, when laser light is emitted from the semiconductor laser 1, its backward emitted light is incident on the lens 2 and is converted to parallel luminous flux and a part of the parallel luminous flux is directly incident on the first photoelectric converter 5 to be converted to a corresponding electric signal "A". Another part of the parallel luminous flux is incident on the etalon-type filter 31. The etalon-type filter 31 transmits light whose transmittance has changed depending on a wavelength of the incident light and the transmitted light is incident on the second photoelectric converter 6 to be converted to a corresponding electric signal "B". Therefore, the electric signal "A" has information about an optical output from the semiconductor laser 1 at the time and the electric signal B has information containing both information about the optical output from the semiconductor laser 1 at the time and information about a wavelength of light being emitted by the semiconductor laser 1 at the time. At this point, by properly adjusting an angle of a plane of incidence of the etalon-type filter 31 relative to an optical axis, the electric signal B transmits information about a reference wavelength to be used as a target for stabilization of wavelengths and about changes in the wavelengths straddling the reference wavelength to an operation circuit 8 at a desired sensitivity.

The electric signals A and B are taken from the wavelength stabilized laser module of the first embodiment and are transmitted to the operation circuit 8. The operation circuit 8 detects a change in the light output of the semiconductor laser 1 from the change in the electric signal A and feeds back a difference between a present output and a reference output as an output shifting signal continuously to an injected current adjusting device (not shown) to stabilize its wavelength of the semiconductor laser light. Moreover, the operation circuit 8 takes a signal component that changes depending on a wavelength from electric signals A and B and, by referring to spectrum data of transmittance for a wavelength stored in advance in the operation circuit 8, calculates a wavelength of light being presently emitted from the semiconductor laser 1 and produces a wavelength shifting signal showing a difference between the wavelength of the light being presently emitted and a reference wavelength to be used as a target for stabilization of wavelengths. Since a wavelength of the semiconductor laser light generally changes depending on an injected current and a temperature of the semiconductor laser device, the wavelength shifting signal is fed back to either of or both of the injected current adjusting device (not shown) or the peltier device (not shown) mounted on the substrate 7, thereby stabilizing wavelengths of an output from the semiconductor laser 1.

The wavelength stabilized laser module of the first embodiment has advantages in that, since parts such as a beam splitter used to obtain a signal that changes depending on a wavelength and a signal that does not change depending on a wavelength is not mounted and one single lens 2 is used, component counts are made smaller and efficiency of using space is excellent and, since the wavelength stabilized laser module is so constructed to be enough compact to be housed in a tightly-spaced case that has housed the conventional semiconductor laser module, assembling and adjusting processes at the time of manufacturing are made simple and manufacturing costs are greatly reduced.

Figure 3:
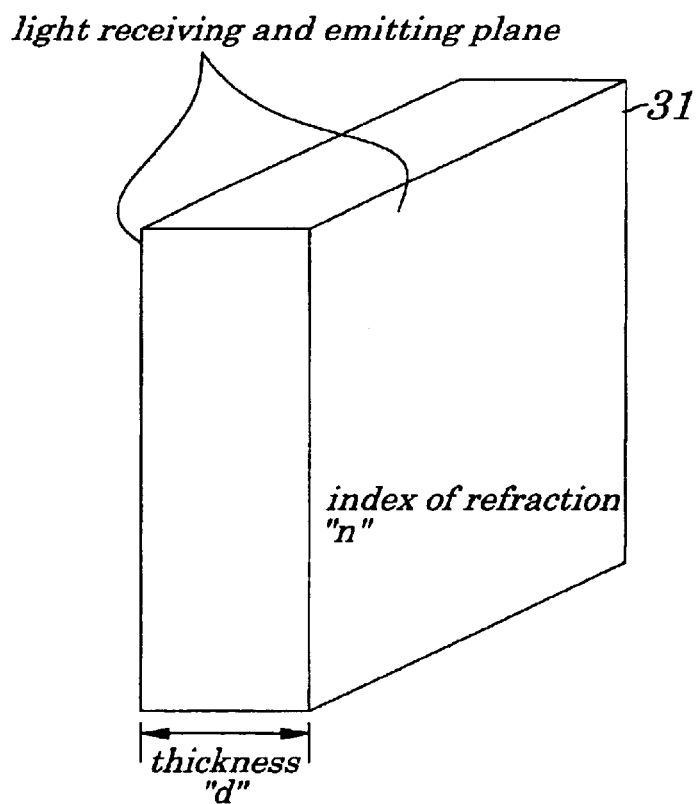
FIG. 3 is a perspective view of an etalon-type filter employed in the wavelength stabilized laser module of the first embodiment of the present invention.
Figure 4:
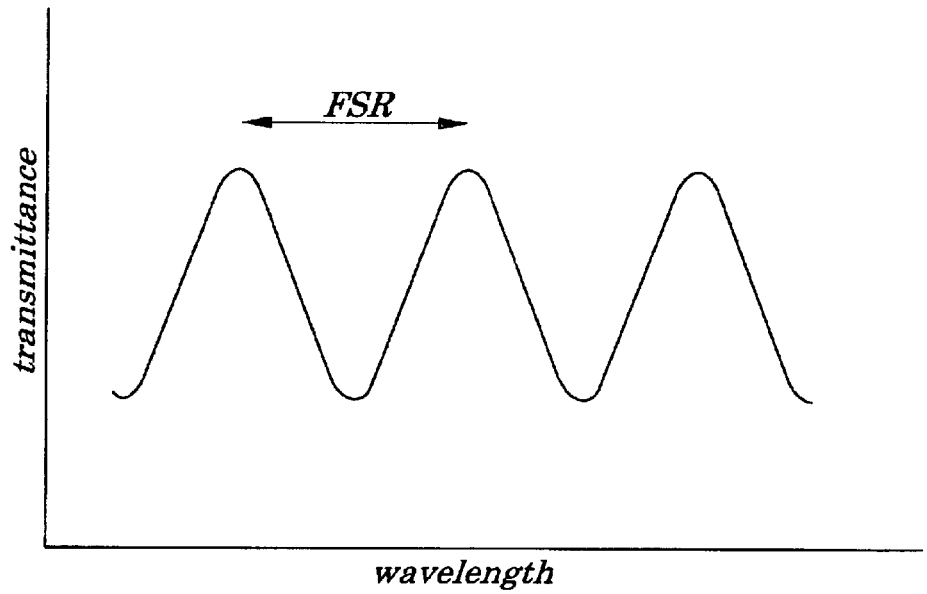
FIG. 4 is a diagram showing a transmission spectrum showing a relationship of a wavelength to transmittance in the etalon-type filter employed in the wavelength stabilized laser module of the first embodiment of the present invention.

Next, configurations and operations of the etalon-type filter 31 will be described below. The etalon-type filter 31 is also called a Fabry-Perot interferometer, which has a characteristic to permit light with a very narrow band width of wavelengths only to pass by interference of light. As shown in FIG. 3, the etalon-type filter 31 is basically an optical glass of a parallel shape with a thickness of "d", whose plane of incidence and emission is polished with high accuracy (about $\frac{1}{100}$ of a wavelength). Within the optical glass having an index of refraction "n" occurs a multiple reflection of light. The etalon-type filter 31 exhibits a characteristic in which transmittance of the light becomes high or low repeatedly due to interference between reflected light and transmitted light, as shown in FIG. 4. The interval between peaks of the transmittance, as shown in FIG. 4, is called an FSR (Free Spectral Range). The FSR is given by the following equation when the light is incident in a vertical direction:

$$FSR = c/2nd \quad (2)$$

where "c" is light velocity, "n" is an index of refraction of glass, "d" is a thickness of the etalon-type filter 31. This means that, by selecting the index of refraction of glass "n" and the thickness "d" of the etalon-type filter 31, the FSR of the etalon-type filter 31 can be freely set.

Figure 5:
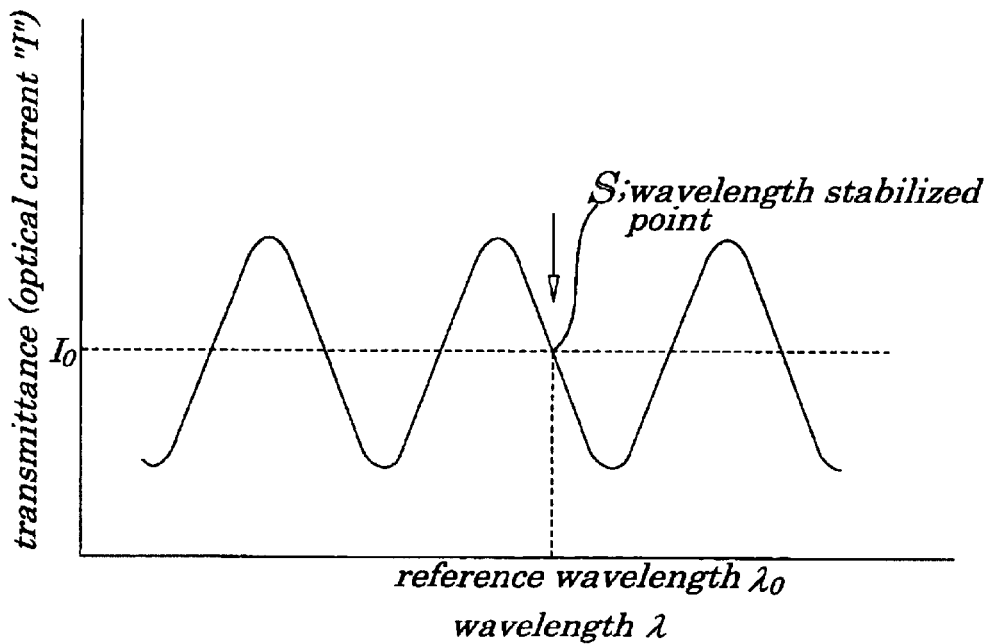
FIG. 5 is a diagram showing a transmission spectrum explaining a wavelength stabilizing operation in an etalon-type filter employed in the wavelength stabilized laser module of the first embodiment of the present invention.

To exert control on the stabilization of the wavelength, a reference wavelength $\lambda_0$ to be used as the target for the stabilization of the wavelength $\lambda$ is set within a band of the wavelengths where the transmittance of the etalon-type filter 31 becomes high or low monotonically, as shown in FIG. 5. The point at which the reference wavelength $\lambda_0$ is set in the transmittance spectrum is referred to as a wavelength stabilized point "S". Let it be assumed that, as shown in FIG. 5, the wavelength stabilized point "S" is set at a midpoint of a band width in which the transmittance becomes low monotonically at a right shoulder of its plotted declined line. At this point, if the transmittance (that is, a value converted to an optical current) of the etalon-type filter 31 at the point "S" being a reference wavelength $\lambda_0$ is I0, when the wavelength $\lambda$ of semiconductor laser light is longer than the reference wavelength $\lambda_0$, the transmittance becomes lower than the transmittance I0 and when the wavelength $\lambda$ is shorter than the reference wavelength $\lambda_0$, the transmittance becomes higher than the transmittance I0. Thus, it is possible to detect a wavelength $\lambda$ of semiconductor laser light by an increase or decrease of the transmittance (I) so long as it is detected within a band of the wavelengths existing in the proximity of the wavelength stabilized point "S". That is, by controlling the transmittance (I) so as to be kept at the I0 level all the time, the wavelength $\lambda$ of light emitted from the semiconductor laser can be stabilized.

Here, let it be assumed that a reference value of an optical current detected by the first photoelectric converter 5 is set so that a forward optical output from the semiconductor laser 1 becomes, for example, 20 mW and an injected current to the semiconductor laser 1 is controlled so that this reference value is maintained all the time. In this state, the optical output remains constant. Moreover, by controlling a temperature of the semiconductor laser 1 so that an optical current from the second photoelectric converter 6 remains the reference current value (that is, reference transmittance) "I0" relative to the wavelength stabilized point "S" indicated by the arrow in FIG. 5, the wavelength $\lambda$ of the semiconductor laser can be stabilized. To control the temperature of the semiconductor laser device, a method for forming a feedback loop by using an analog electronic circuit or a software feedback method to convert the temperature to digital data using an A/D converter and to construct a control circuit on a computer may be used.

Figure 6A:
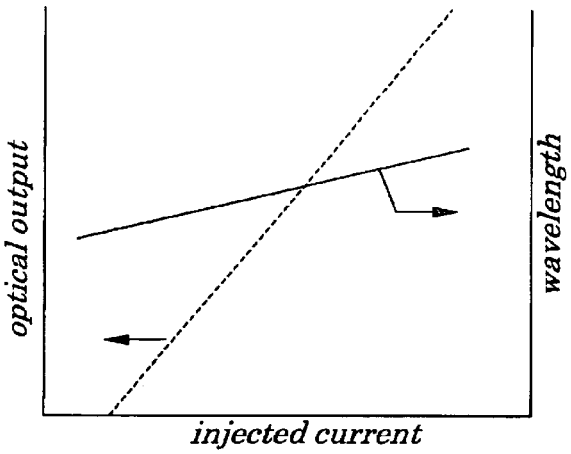
FIG. 6A is a graph showing factors to change an optical output of a semiconductor laser used in the wavelength stabilized laser module of the first embodiment of the present invention.
Figure 6B:
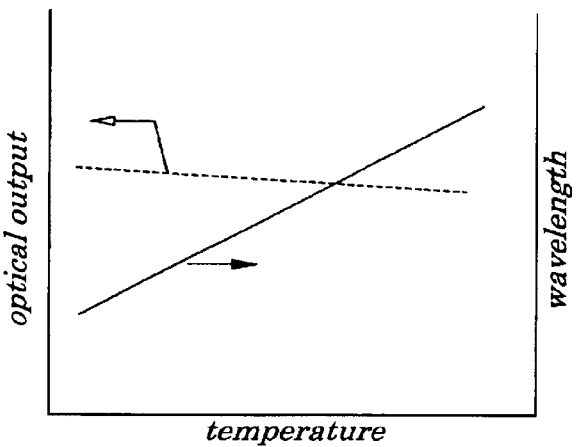
FIG. 6B is also a graph showing factors to change the optical output of the semiconductor laser used in the wavelength stabilized laser module of the first embodiment of the present invention.

Furthermore, as shown in FIGS. 6A and 6B, oscillation wavelength of the semiconductor laser 1 is changed not only by a temperature of the semiconductor laser 1 but also by an injected current, while an optical output is changed not only by the injected current but also by the temperature of the semiconductor laser 1. Therefore, to keep the optical output at a constant level by controlling an optical current of the first photoelectric converter 5 shown in FIG. 1, a feedback loop adapted to simultaneously control the injected current and the temperature of the semiconductor laser 1 may be used. Similarly, to keep the oscillation wavelength constant by controlling an optical current of the second photoelectric converter 6, a feedback loop adapted to simultaneously control the injected current and the temperature of the semiconductor laser 1 may be employed.

Figure 7:
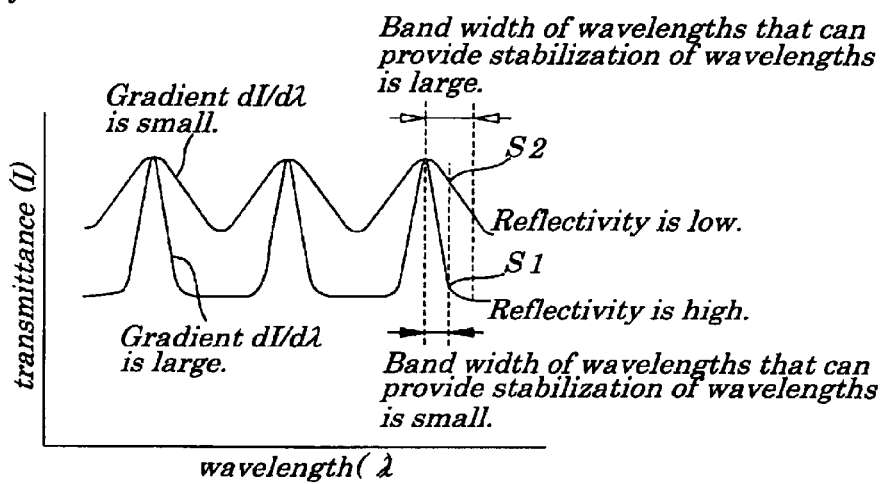
FIG. 7 is a diagram showing a transmission spectrum explaining a transmission characteristic of the etalon-type filter employed in the wavelength stabilized laser module of the first embodiment of the present invention.

As described above, controllability of a wavelength $\lambda$ of the wavelength stabilized laser module depends greatly on a transmission characteristic of the etalon-type filter 31. As shown in FIG. 7, a gradient at the shoulder portion in a transmittance period including the wavelength stabilized point "S", that is, a value of $dI/d\lambda$ is very important because it has a big influence on a gain of the feedback loop. The transmission characteristic of the etalon-type filter changes depending greatly on reflectivity of a plane of incidence and emission, as shown in FIG. 7. That is, when the reflectivity of the plane of incidence and emission of the etalon-type filter 31 is high, the transmission characteristic is featured by such a sharply declined line of transmittance as were to be approximated by a delta function and the gradient $dI/d\lambda$ at a wavelength stabilized point S1 becomes large. However, at this point, a band width of wavelengths that can provide stabilization of wavelengths is made smaller. On the other hand, when the reflectivity of the plane of incidence and emission of the etalon-type filter 31 is low, the transmission characteristic is featured by a sine-curve-like line showing the transmittance, the band width of the wavelengths that can provide stabilization of wavelengths is made larger. However, at this point, the gradient $dI/d\lambda$ at a wavelength stabilized point S2 becomes smaller. Thus, if stability of the wavelength with high accuracy is required, it is preferable to increase the reflectivity of the plane of incidence and emission of the etalon-type filter 31. If a wide band of wavelengths rather than the stability of the wavelength is required, it is preferable to decrease the reflectivity of the plane of incidence and emission of the etalon-type filter 31.

Moreover, in order to adjust the band width of the wavelengths that can provide stability of wavelengths, calibration of the FSR of the etalon-type filter 31 is effective. In order to widen the band of the wavelengths that can provide stability of wavelengths, the FSR has to be made larger and the reflectivity of the plane of incidence of the etalon-type filter 31 has to be made smaller. If the gradient $dI/d\lambda$ is large enough to stabilize the wavelength, the etalon-type filter 31 having an arbitrary FSR can be used for the wavelength stabilized laser module of the present invention.

Figure 8:
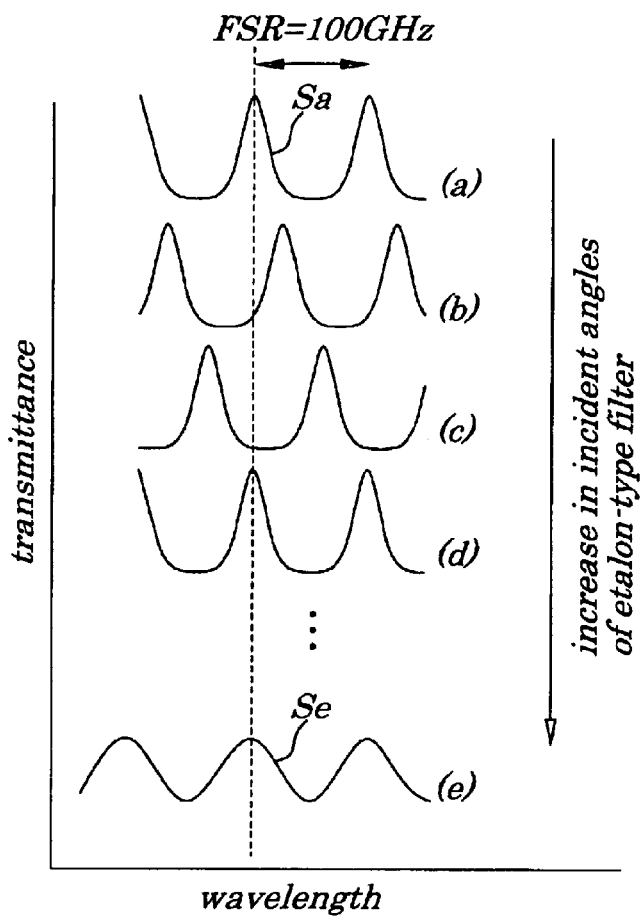
FIGS. 8(a), (b), (c), (d) and (e) show transmission spectra illustrating changes of peaks of wavelength in the etalon-type filter employed in the wavelength stabilized laser module of the first embodiment of the present invention.

In the wavelength stabilized laser module of the present invention, transmission characteristics of the etalon-type filter 31 can be freely changed only by the calibration of an angle of incidence of the etalon-type filter 31. For example, as shown in FIG. 8(a), if the FSR of the etalon-type filter is pre-set to a very narrow value of 100 GHz (0.8 nm), reflectivity of a plane of incidence is pre-set to a relatively high level of about 60% and an incident angle of parallel luminous flux into a light receiving surface of the etalon-type filter 31 is set to be 0°, a gradient at a wavelength stabilized point Sa is very large. Here, when the incident angle of the etalon-type filter 31 is gradually tilt, the transmission spectrum, in other word the peak wavelength is shifted as shown in FIGS. 8(b) and 8(c), and when the incident angle of the etalon-type filer 31 is tilt further, the transmission spectrum, in other word the peak wavelength is shifted by its width, that is, by one period. At this point, since the reflectivity of the plane of incidence and emission of the etalon-type filter 31 decreases with increasing incident angles, the amplitude of a wave showing the transmittance of the etalon-type filter 31 becomes low, thus causing the gradient at a wavelength stabilized point Se to be made smaller as shown in FIG. 8(e). Thus, according to the wavelength stabilized laser module of the present invention, only by adjusting the angle of the etalon-type filter 31, it is made possible to set the reference wavelength $\lambda_0$ for the stabilization of the wavelength $\lambda$ of the laser light and to calibrate the gradient at the wavelength stabilized point S, which is an important parameter in the feedback loop for the stabilization of wavelengths.

Even if the angle of the etalon-type filter 31 is changed, since no deviation of an optical axis toward the array-shaped optical detector 4 occurs, when the reference wavelength $\lambda_0$ for the stabilization is set, the adjustment of the incident angle of the etalon-type filter 31 is all that is needed and there is no need for adjustment of a position of the array-shaped optical detector 4.

Unlike the conventional examples 1 to 4 described above in which the adjustment of levels of two signals is required for the stabilization of wavelengths at the point when the difference in levels of the signals which change depending on the two wavelengths becomes 0 (zero), in the present invention, since each of signals from the first photoelectric converter 5 and second photoelectric converter 6 is independently output to the operation circuit 8, there is no need for the adjustment of levels of the two signals in the case where the wavelength stabilized laser module is housed. This can provide a wider allowance to the positional deviation of the array-shaped optical detector 4.

Figure 17:
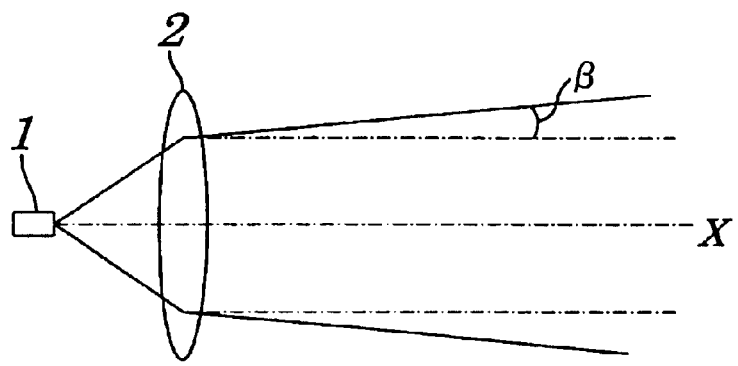
FIG. 17 is a conceptual illustration showing a degree of parallelization of light transmitted through a lens employed in the first embodiment of the present invention.

When the wavelength stabilized laser module is applied to the DWDM method in the optical communication systems, a very high wavelength accuracy has to be ensured. In order to obtain the high wavelength accuracy, the increased gradient at the wavelength stabilized point S is effective. That is, it is necessary to increase an amplitude (ON/OFF ratio) of the wave showing the transmittance of the etalon-type filter 31. For example, as shown in FIG. 17, if a degree of parallelization of parallel luminous flux which has been converged by the lens 2 is low, that is, if a beam angle shifted from a parallel position is large and if the beam is spread or narrowed, light incident on the etalon-type filter 31 at a different angle is included in light received by the second photoelectric converter 6 (the beam angle shifted from a parallel position being referred to as a "beam shifted angle"). On the other hand, since the transmission characteristic of the etalon-type filter 31 has a dependence on the incident degree, if there is a variable range of the degree of incidence of light, a band width occurs in the wavelength of the light transmitted through the etalon-type filter 31. Here, this band width of wavelengths is hereinafter called a "light receiving wavelength width". In order to improve the wavelength accuracy, this light receiving wavelength width must be narrower. Experiments has shown that, if the light receiving wavelength width exceeds, for example, 100 pm, it is difficult, from a viewpoint of accuracy, for the etalon-type filter 31 to be applied to the wavelength stabilizing device for the DWDM optical communication systems. This means that it is necessary to obtain the degree of parallelization of light that can cause the light receiving wavelength to be, for example, not more than 100 pm.

Figure 18:
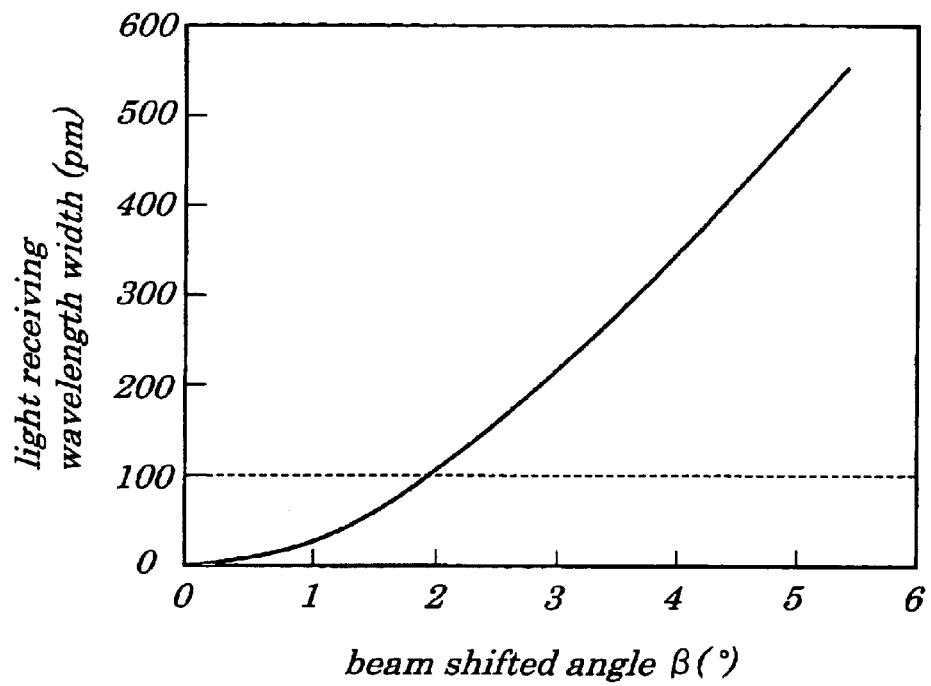
FIG. 18 is a graph showing an example of a relationship between a light receiving wavelength width and a beam shifted angle in the first embodiment of the present invention.
Figure 19:
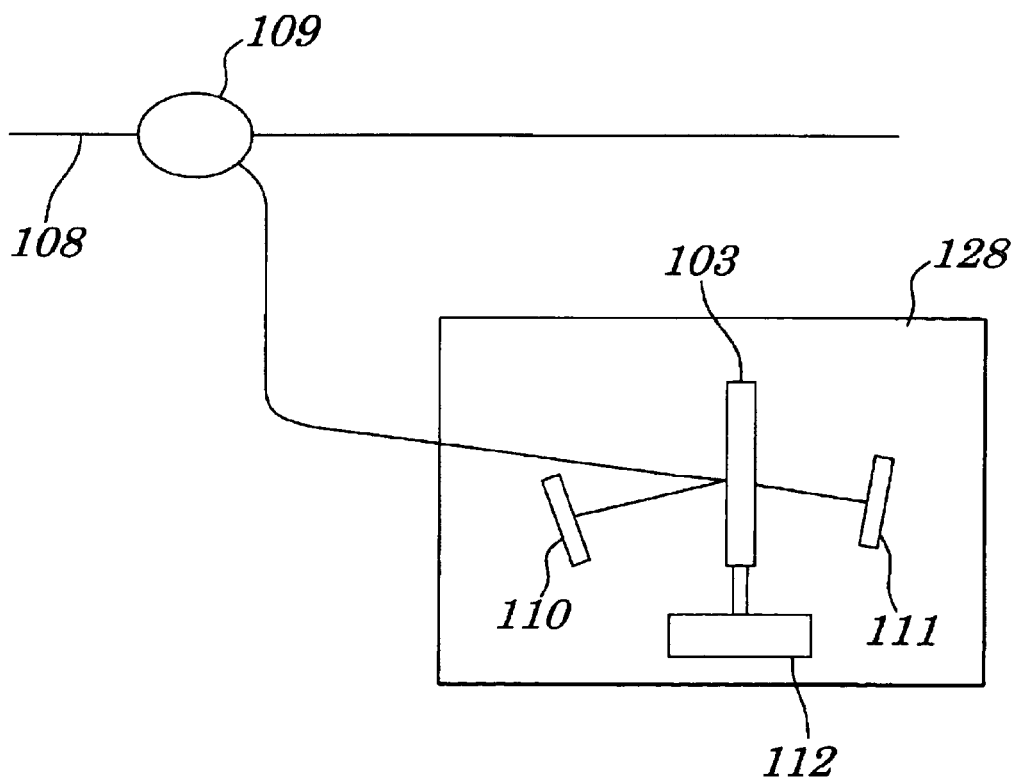
FIG. 19 is a diagram showing configurations of a first example of a conventional wavelength stabilizing device.
Figure 20:
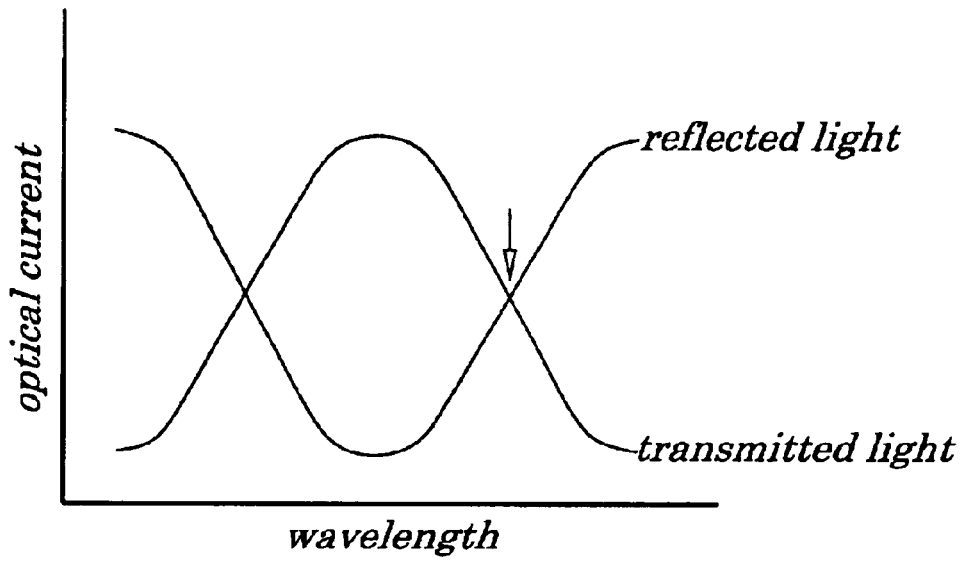
FIG. 20 is a diagram showing optical current spectra to explain operations of the conventional wavelength stabilizing device of FIG. 19.
Figure 21:
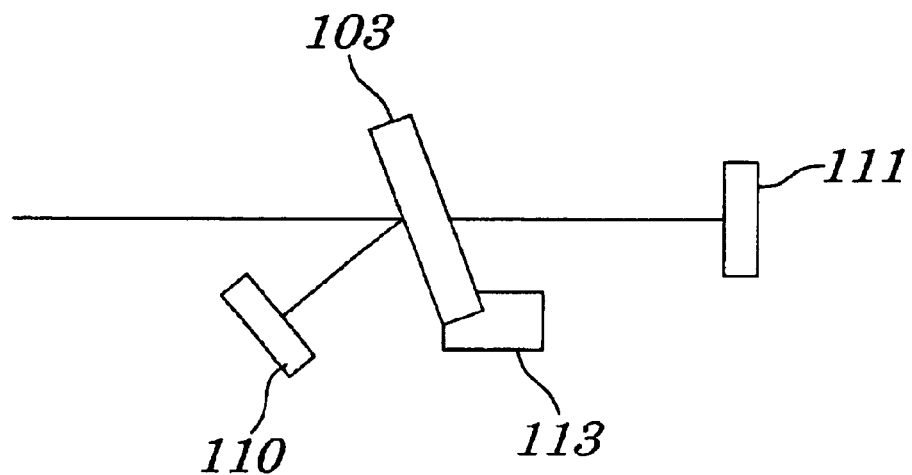
FIG. 21 is a diagram showing configurations of a second example of a conventional wavelength stabilizing device.
Figure 22:
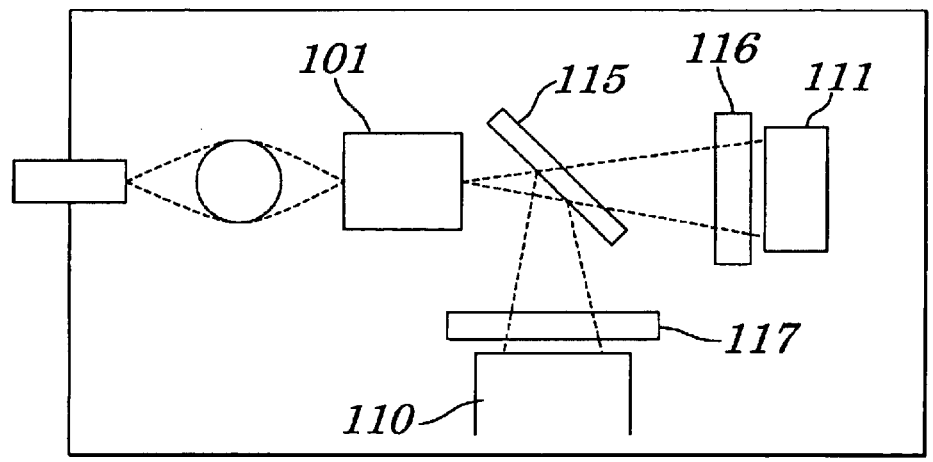
FIG. 22 is a diagram showing configurations of a third example of the conventional wavelength stabilizing device.
Figure 23:
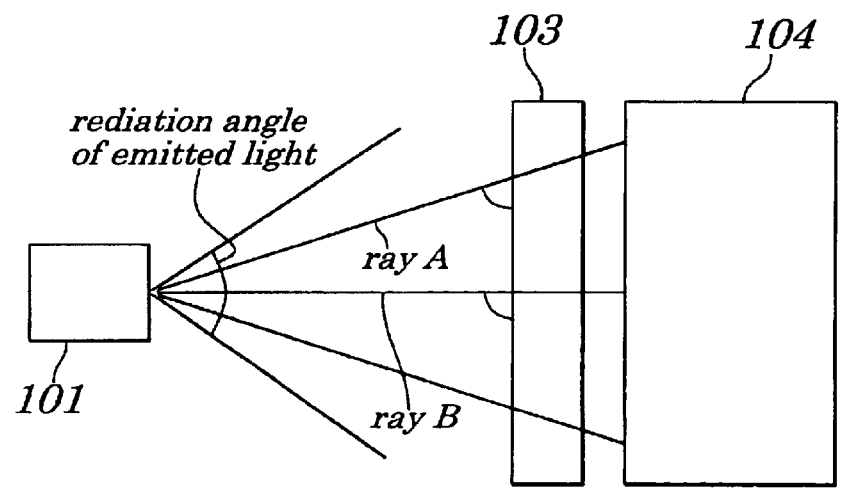
FIG. 23 is a diagram explaining operations of a conventional wavelength stabilizing device of FIG. 21.
Figure 24:
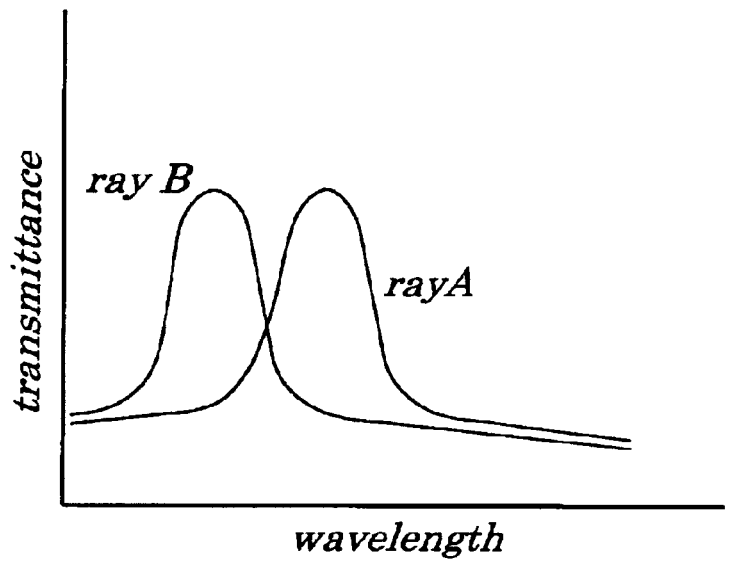
FIG. 24 is a diagram showing a transmission spectrum explaining operations of the conventional wavelength stabilizing device of FIG. 21.
Figure 25:
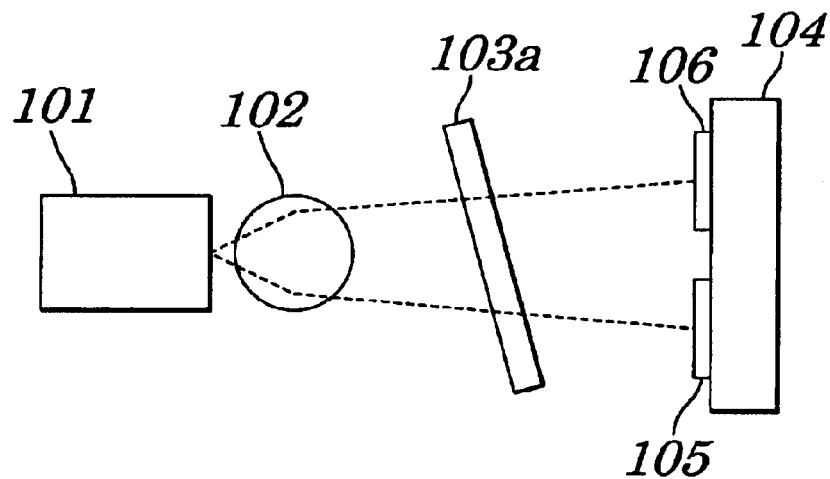
FIG. 25 is a diagram showing configurations of another conventional wavelength stabilizing device.
Figure 26:
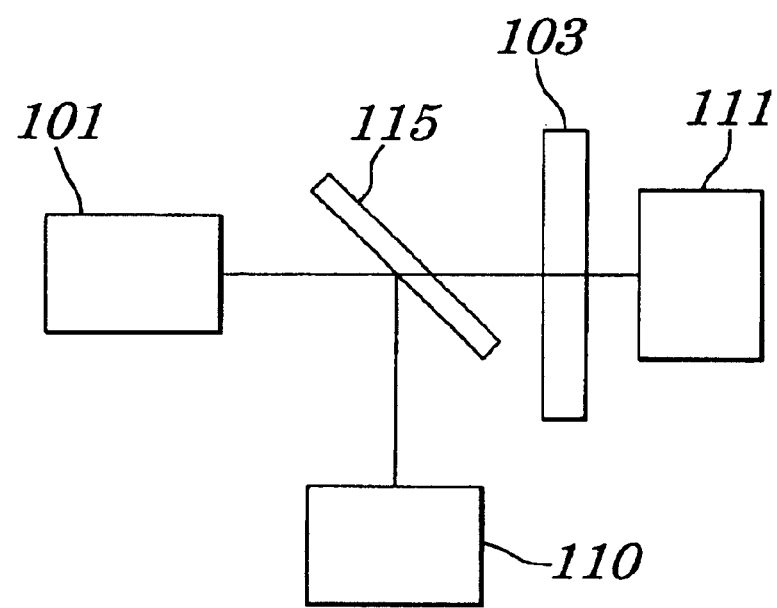
FIG. 26 is a diagram showing configurations of still another conventional wavelength stabilizing device.

FIG. 18 is a graph showing an example of a relationship between the light receiving wavelength width and a beam shifted angle. In FIG. 18, the example is shown in which a diameter of light received by the second photoelectric converter 6 is 0.05 mm, a position of a light receiving plane of the lens 2 is deviated by 0.2 mm from a center, a distance between a position of a main surface of the lens to a position of its light receiving plane and the etalon-type filter 31 is displaced vertical to an optical axis X. As is apparent from FIG. 18, in order to cause the light receiving wavelength width to be not more than 100 pm so that the etalon-type filter 31 can be applied to the wavelength stabilizing device for the DWDM optical communication systems, the degree (that is, the beam shifted angle) of parallelization of the parallel luminous flux which has converged by the lens 2 is preferably within ±2°. A method of causing the degree of parallelization to be within ±2° is simpler when compared with a method in which, for example, a lens used to gather light in optical fibers is mounted with high accuracy. Moreover, the method of causing the degree of parallelization to be within ±2° does not require expensive optical devices such as an aspherical lens or a like.

The wavelength stabilized laser module of the first embodiment, as shown in FIG. 1, so configured that a lens 18 used to connect optical fibers, an optical isolator 21, a thermistor 29 used to detect temperatures or a like are mounted on the substrate 7 and embedded, together with the semiconductor laser 1, lens 2, etalon-type filter 31, array-shaped optical detector 4 having first photoelectric converter 5 and second photoelectric converter 6, in such the case 9 as has been used for housing the conventional semiconductor laser module. An optical fiber 14 is connected to the case 9 to emit light for optical communication. The temperature of the substrate 7 is controllable by using the Peltier device attached to the substrate 7 which controls the temperature of the semiconductor laser device 1, thus stabilizing oscillation wavelengths of the laser light. By this structure, all the temperatures of other optical devices embedded in the case 9 can be also controlled to be kept at a constant level. Thus, the semiconductor laser module of the embodiment of the present invention are so compact that it can be housed in such the case 9 as has been used for housing the conventional semiconductor laser module.

As described above, according to the embodiment, by embedding the semiconductor laser 1, lens 2, etalon-type filter 31 and first photoelectric converter 5 and second photoelectric converter 6 or the like in such the case 9 as has been used for housing the conventional semiconductor laser module, the semiconductor laser module whose wavelength is stabilized with high accuracy can be implemented.

Second Embodiment

Figure 9:
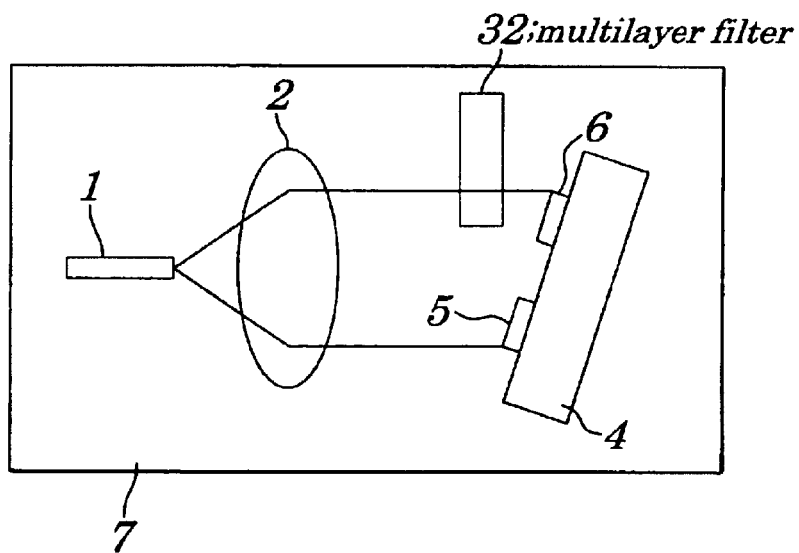
FIG. 9 is a diagram showing configurations of a wavelength stabilizing device employed in a wavelength stabilized laser module according to a second embodiment of the present invention.

FIG. 9 is a diagram showing configurations of a wavelength stabilizing device employed in a wavelength stabilized laser module according to a second embodiment of the present invention. The wavelength stabilizing device represents an assembly including, at least, the semiconductor laser, lens, filter, first and second photoelectric converters which are embedded in the wavelength stabilized laser module. Configurations of the wavelength stabilizing device of the second embodiment are substantially the same as those of the first embodiment. However, in the second embodiment, instead of an etalon-type filter used as a filter to obtain signals having an dependence on a wavelength, a multilayer filter 32 made up of dielectric multilayers formed on a glass substrate is used. The multilayer filter 32 has a merit in that, since a thickness of a glass substrate can be arbitrarily set, the substrate can be made thinner and compact. Effects or usage methods of the wavelength stabilizing device of the second embodiment are substantially the same as those of the first embodiment.

Third Embodiment

Figure 10:
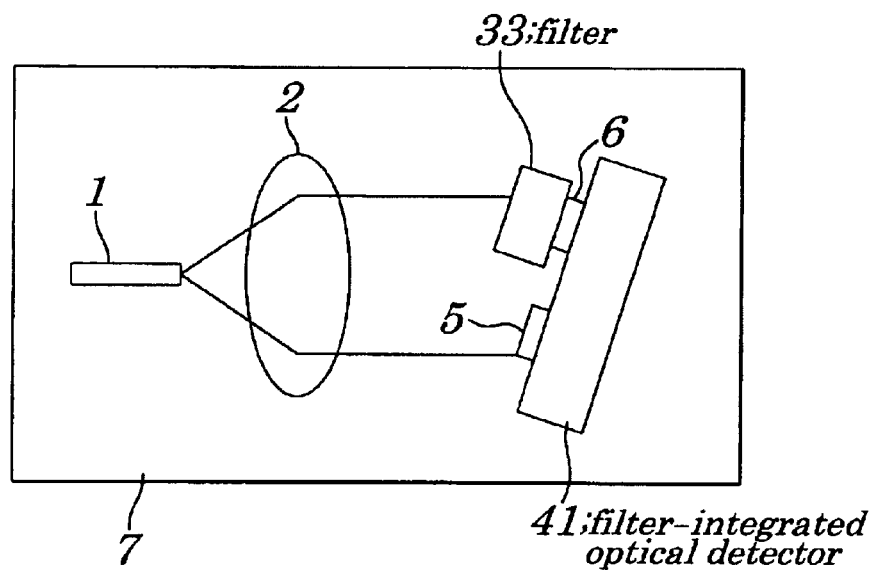
FIG. 10 is a diagram showing configurations of a wavelength stabilizing device employed in a wavelength stabilized laser module according to a third embodiment of the present invention.

FIG. 10 is a diagram showing configurations of a wavelength stabilizing device employed in a wavelength stabilized laser module according to a third embodiment of the present invention. Configurations of the wavelength stabilizing device of the third embodiment differ from those of the first embodiment in that a filter 33 used to obtain a signal having a dependence on a wavelength is affixed to one of two photoelectric converters 5 and 6 (in this case, to the photoelectric converter 6) in a fixed manner. As the filter 33 of the third embodiment, any one of filters including an etalon-type filter used in the first embodiment, a multilayer filter used in the second embodiment and other filters having same functions may be employed. In the third embodiment, adjustment of the wavelength in a transmission period and of a gradient of transmittance having a dependence on a wavelength, and optimization of an optical detection strength can be implemented easily by optimizing an angle or a position relative to an optical axis of a filter-integrated optical detector 41. The wavelength stabilized laser module has a merit in that the wavelength stabilizing device which has become more compact is embedded.

Fourth Embodiment

Figure 11:
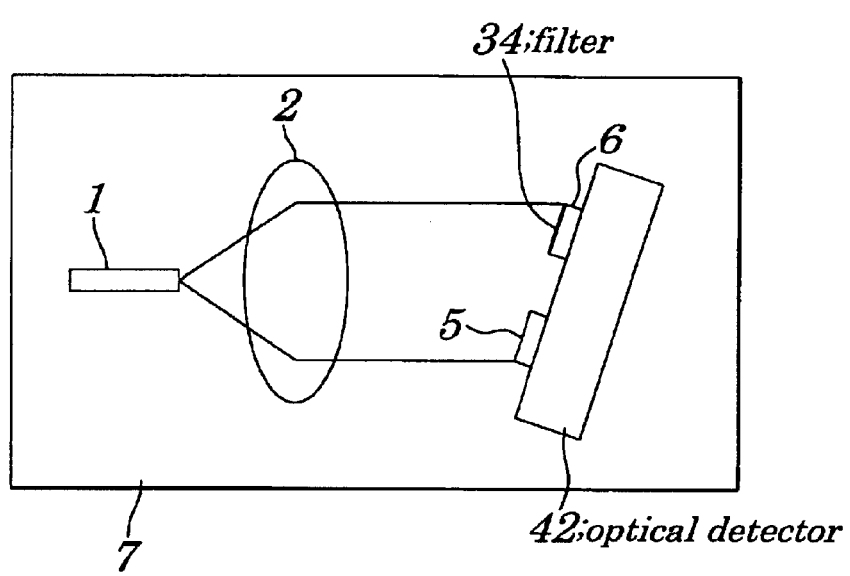
FIG. 11 is a diagram showing configurations of a wavelength stabilizing device employed in a wavelength stabilized laser module according to a fourth embodiment of the present invention.

FIG. 11 is a diagram showing configurations of a wavelength stabilizing device employed in a wavelength stabilized laser module according to a fourth embodiment of the present invention. Configurations of the wavelength stabilizing device of the third embodiment differ from those of the first embodiment in that a filter 34 used to obtain a signal having a dependence on a wavelength is formed by a coating process to one of a first photoelectric converter 5 and second photoelectric converter 6 (in this case, to the second photoelectric converter 6). That is, the filter 34 is formed in a manner that a light receiving plane of the second photoelectric converter 6 is directly coated with dielectric multilayer films. According to the fourth embodiment, since the second photoelectric converter 6 also serves as a substrate of a dielectric multilayer, it is possible to reduce component counts further and to decrease a thickness of an optical detector 42 more when compared with a case of the third embodiment, thus enabling to provide a more compact wavelength stabilized laser module.

Fifth Embodiment

Figure 12:
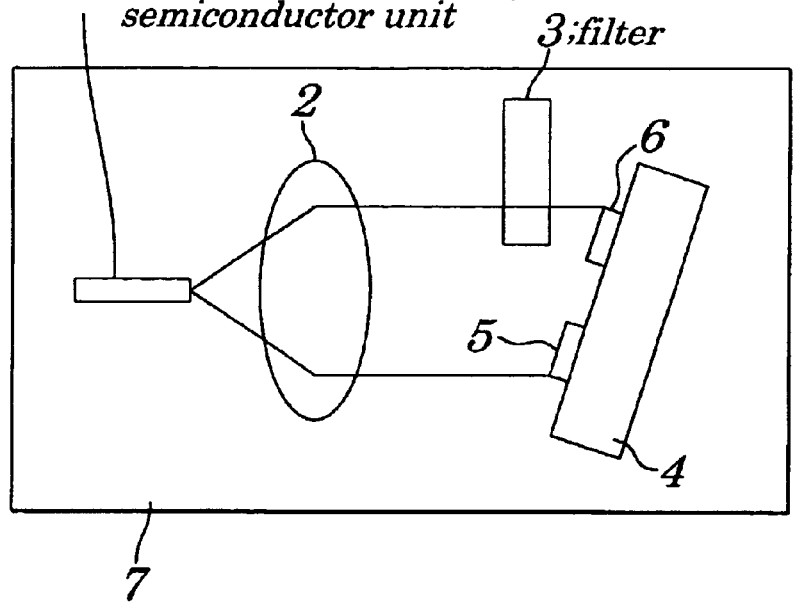
FIG. 12 is a diagram showing configurations of a wavelength stabilizing device employed in a wavelength stabilized laser module according to a fifth embodiment of the present invention.

FIG. 12 is a diagram showing configurations of a wavelength stabilizing device employed in a wavelength stabilized laser module according to a fifth embodiment of the present invention. Configurations of the fifth embodiment are substantially the same as those of the first embodiment, however, differ from those in that a semiconductor laser 11 having a configuration of a device integrated with an electro-absorption-type semiconductor optical modulator is used. This semiconductor laser 11 is so configured as to be integral with the electro-absorption-type optical modulator, unlike a case where a widely-used DFB laser and an outside optical modulator are separately constructed as an independent module; this construction has a merit in that an entire optical transmission system can be made more compact as a whole.

Sixth Embodiment

Figure 13:
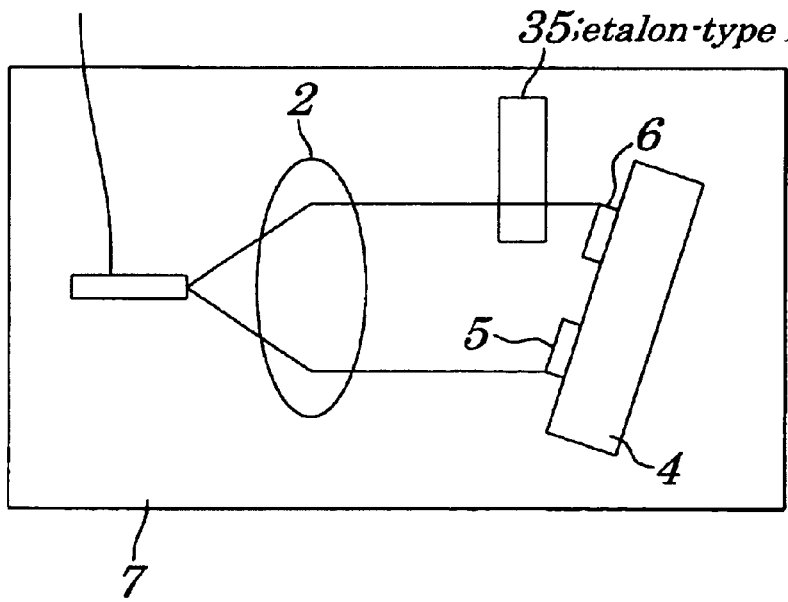
FIG. 13 is a diagram showing configurations of a wavelength stabilizing device employed in a wavelength stabilized laser module according to a sixth embodiment of the present invention.

FIG. 13 is a diagram showing configurations of a wavelength stabilizing device employed in a wavelength stabilized laser module according to a sixth embodiment of the present invention. Configurations of the sixth embodiment are substantially same as those of the first embodiment, however, differ from those in that a wavelength tunable semiconductor laser 12 and an etalon-type filter 35 having an FSR being 90 GHz are used.

Figure 14:
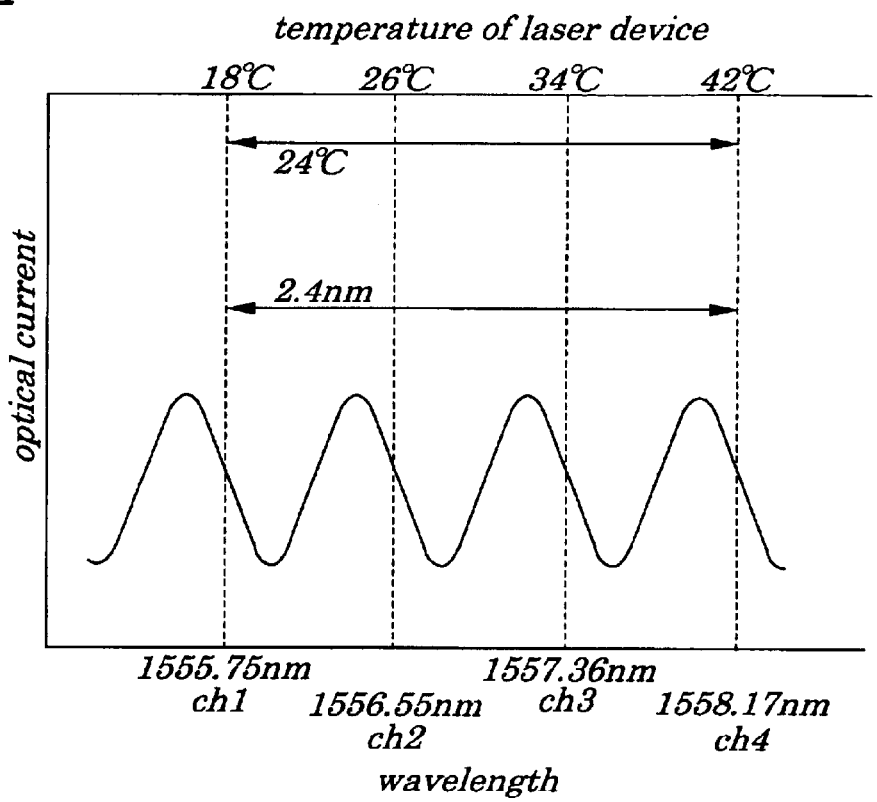
FIG. 14 is a diagram showing a transmission spectrum explaining dependence on a temperature of the transmission characteristic of the etalon-type filter in the sixth embodiment of the present invention.

The wavelength tunable semiconductor laser 12 will be described. The wavelength tunable semiconductor laser 12, even in the case of one semiconductor laser device, can change its oscillation wavelength. In a DWDM communication system which has become used widely in recent years, a light source unit including a different semiconductor laser that can be used for each of channels each having a different wavelength is required. Backup light units in a same number of the light source units are also necessary and, therefore, as a number of channels in the DWDM communication system increases, costs for the backup light units tend to increase. If one wavelength tunable semiconductor laser can serve as back-up for a plurality of channels, costs are so reduced. There is an increasing demand for the wavelength tunable semiconductor laser 12 that can be used simultaneously for 2 or 4 channels, or more channels. The wavelength tunable semiconductor laser 12 having a most general configuration and is becoming commercially practical is a type of laser that can change oscillation wavelength by controlling a temperature of a conventional DFB semiconductor laser. In general, in the case of the DFB semiconductor laser device emitting laser light in a band of a wavelength being 1.55 nm, when the temperature of the DFB semiconductor laser device is changed by 10° C., its oscillation wavelength changes by about 1 nm. That is, as shown in FIG. 14, a wavelength of 2.4 nm being equivalent to 4 channels can be covered by changing the temperature of the DFB semiconductor laser device by ±12° at an interval of 100 GHz (0.8 nm).

The wavelength tunable semiconductor laser 12 that can cover the above four channels is embedded in the wavelength stabilized laser module of the sixth embodiment. Thus, control on stabilization of wavelengths at a plurality of wavelengths at a same interval can be implemented by configuring the wavelength stabilizing device using an etalon-type filter 35 having a same FSR as the wavelength interval so that a transmittance period being different for every reference wavelength for stabilization is detected. However, a widely-used silica-based glass generally used as a material for the etalon-type filter 35 has a dependence on temperatures of the semiconductor laser device. For example, as in the case of the first embodiment, to stabilize one reference wavelength, a range of temperatures to be controlled can be within ±1° C. However, as in the case of the sixth embodiment, to change a temperature of the semiconductor laser device by 24° C., an influence by temperature characteristics of the etalon-type filter 35 is not negligible. As shown in an upper part of FIG. 15, in the general etalon-type filter 35, every time the temperature of the semiconductor laser changes by 10° C., a position of a central wavelength is shifted by 0.1 nm.

Figure 15:
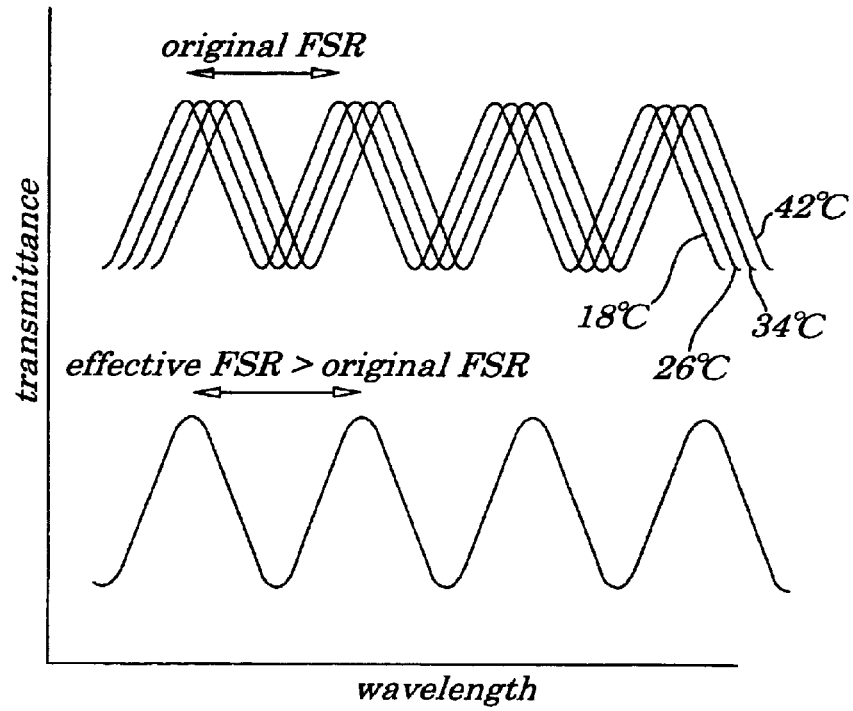
FIG. 15 is also a diagram showing the transmission spectrum explaining dependence on a temperature of the transmission characteristic of the etalon-type filter in the sixth embodiment of the present invention.

In the wavelength stabilized laser module of the embodiment, since the etalon-type filter 35 and the wavelength tunable semiconductor laser 12 are mounted on the substrate 7 providing a same calibrated temperature to both of them so that the temperature of the etalon-type filter 35 and the wavelength tunable laser 12 can be controlled to be kept at a same level, when the oscillation wavelength of the wavelength tunable semiconductor laser 12 changes as the temperature of the substrate 7 changes, transmittance of the etalon-type filter 35 exhibits dependence on the wavelength with changing temperatures of the substrate 7, as shown in a lower part of FIG. 15. That is, the FSR of the etalon-type filter 35 is made wider than its original FSR at a time of actual operations. The FSR to be used in actual operations is called an "effective FSR". Therefore, by setting the effective FSR to 100 GHz (0.8 nm) being used for an wavelength interval in the DWDM system, the stabilization of the wavelength for each channel is made possible.

A relationship between the original and effective FSRs of the etalon-type filter 35 can be given, using temperature characteristics of the etalon-type filter 35 and temperature dependence of the oscillation wavelength of the semiconductor laser, by the following equation:

$$D = (1 - \text{Tetalon}/TLD) \times D0 \quad (1)$$

where "D" represents the wavelength interval in the transmittance period of the etalon-type filter 35, "D0" represents intervals of a plurality of wavelengths of light emitted from the wavelength tunable semiconductor laser 12, "Tetalon" represents amounts of changes in a central wavelength occurring when the temperature of the etalon-type filter 35 changes by 1° C. and "TLD" represents amounts of changes in the oscillation wavelength occurring when the temperature of the semiconductor laser device changes by 1° C. However, the central wavelength represents one wavelength at which the transmittance becomes maximum.

Next, a method for stabilizing a plurality of reference wavelengths in the wavelength tunable semiconductor laser 12 will be described below. Here, as shown in FIG. 14, let it be assumed that the wavelength tunable semiconductor laser 12 which operates at wavelengths covering ch 1 (channel 1) to ch 4 (channel 4) (1555.75 nm to 1558.17 nm) is used. Operating temperatures of the semiconductor laser device during the ch 1 to ch 4, as shown in FIG. 14, 18° C., 26° C., 34° C. and 42° C., respectively. At this point, since the TLD is about 0.1 nm/° C. and Tetalon is about 0.01 nm/° C., in order to cause the effective FSR to be 100 GHz, the original FSR of the etalon-type filter 35 has to be 90 GHz. Then, by adjusting the angle of the etalon-type filter 35, the dependence of the transmittance on the wavelength at each of the temperatures is as shown in the upper part of FIG. 15 and the effective FSR can be almost 100 GHz as shown in the lower part of FIG. 15. By mounting the etalon-type filter 35 having the above setting in front of a second photoelectric converter 6 for monitoring the wavelength, the stabilization of the wavelength for each channel can be made possible, as in the case of the first embodiment.

Though, in the above sixth embodiment, the stabilization of the wavelength is performed by using the gradient at the right shoulder of the transmittance period of the etalon-type filter 35, it is needless to say that the same effect can be achieved by using the gradient at the left shoulder of the transmittance period. Moreover, it is possible to perform the stabilization of the wavelength at an interval of a half of the FSR, that is, at an interval of 50 GHz, by using the gradients at the right and left shoulders of the transmittance period. However, in this case, since the control direction for each channel in a feedback loop is reversed, correction in the wavelength stabilized laser module is required.

Moreover, in the sixth embodiment, the original FSR of the etalon-type filter 35 is set at 90 GHz, however, since an optimum value of the original FSR varies depending on temperature characteristics of the etalon-type filter 35, the FSR has to be set after the temperature characteristics of the etalon-type filter 35 have been obtained. The accuracy required when the effective FSR is matched with the intervals of the plurality of reference wavelengths is about ±3%. However, the required accuracy varies depending on a band of the wavelength that can be stabilized and on the number of wavelength channels to be stabilized and, therefore, when the band of the wavelength that can be stabilized is narrow or when the number of wavelength channels to be stabilized is large, more higher accuracy is required accordingly.

Seventh Embodiment

Figure 16:
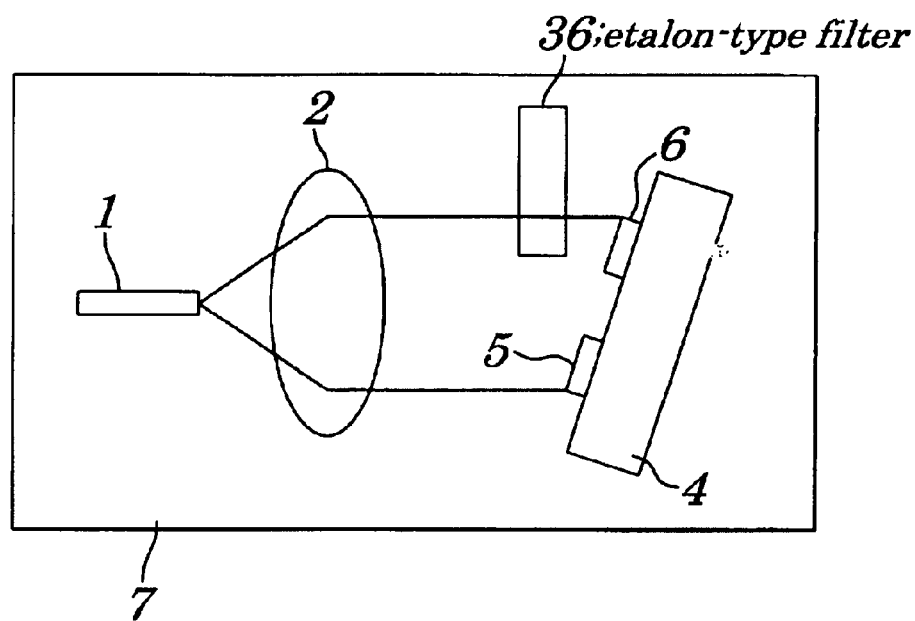
FIG. 16 is a diagram showing configurations of a wavelength stabilizing device employed in a wavelength stabilized laser module according to a seventh embodiment of the present invention.

FIG. 16 is a diagram showing configurations of a wavelength stabilizing device employed in a wavelength stabilized laser module according to a seventh embodiment of the present invention. Configurations of the wavelength stabilizing device of the seventh embodiment are substantially the same as those of the first embodiment, however, differ in that an etalon-type filter 36 using Si (silicon) materials is used as a filter to obtain a signal having dependence on a wavelength. Generally, though the etalon-type filter made up of silica-based materials is used, the silica-based materials are expensive. By using the Si-based materials, costs for the manufacturing and working can be reduced. The Si-based etalon-type filter used for transmitting of light having wavelengths of 1.3 nm to 1.6 nm in optical communication is almost transparent and can be used as a filter having a low-loss characteristic. Moreover, there is a big possibility that micro-machining technology that is approaching maturity in recent years can be applied to the Si-based filter and that, by using such micro-machining technology, very highly accurate adjustment of angles or positions of the Si-based substrate etalon-type filter can be implemented.

Furthermore, since reflectivity of the Si-material is twice as high as that of the silica-based material, a thickness of the etalon-type filter can be made smaller. When an FSR is set to a small value being not more than 50 GHz in particular, if the silica-based material is used, thickness of the etalon-type filter becomes not less than 2 mm, thus causing diffraction light at an edge of the etalon-type filter to be incident on a first photoelectric converter 5 and malfunctions to occur. If the Si-based material is used for the etalon-type filter substrate, even if the FSR is as small as 50 GHz, thickness of the etalon-type filter becomes about 1 mm, which solves the above problem.

As described above, according to the embodiments of the present invention, by having a device used to convert emitted semiconductor laser light to parallel luminous flux, a first photoelectric converting device used to receive a part of the parallel luminous flux and to convert it to an electric signal, a filter used to receive a part of the parallel luminous flux and to continuously change its transmittance depending on a wavelength of the parallel luminous flux and a second photoelectric converting device used to receive light transmitted through the filter and to convert it to an electric signal, component counts are reduced and a space to house related parts is efficiently used, thus enabling configurations of the wavelength stabilizing device to be compact enough to be housed in such the case as has been used for housing the conventional semiconductor laser module and, since the adjustment and assembly at a time of manufacturing are made simple due to reduced component counts, manufacturing costs can be greatly reduced.

It is apparent that the present invention is not limited to the above embodiments but may be changed and modified without departing from the scope and spirit of the invention. For example, in the above embodiments, a first photoelectric converter and second photoelectric converter are configured to be integral with an optical detector in a manner that these two converters make up an optical detector having two array-shaped light receiving planes, however, each of these first and second photoelectric converters may be arranged in parallel separately as a single unit. When each of these photoelectric converters is individually mounted in a single manner and/or in an array-shaped state, characteristics and/or light receiving surface areas of each of the converters may be the same or different.

What is claimed is:

1. A wavelength stabilized laser module, comprising:
   a semiconductor laser;
   a temperature calibrating unit to calibrate a temperature of said semiconductor laser;
   only one lens to arrange light emitted from said semiconductor laser so as to be a single parallel luminous flux;
   a first photoelectric converting unit to receive one part of said parallel luminous flux and to convert it to a first electric signal;

a filter to receive another part of said parallel luminous flux and to continuously change its transmittance depending on wavelengths of said light;

a second photoelectric converting unit to receive light transmitted through said filter and to convert it to a second electric signal;

wherein a control signal, to be used for stabilization of wavelengths, obtained by computations of said first electric signal and said second electric signal fed from said first photoelectric converting unit and said second photoelectric converting unit, is fed back to said semiconductor laser and/or said temperature calibrating unit so that said semiconductor laser is able to stably emit laser light having a reference wavelength to be used as a target for stabilization of wavelengths.

2. The wavelength stabilized laser module according to claim 1, wherein said first photoelectric converting unit and said second photoelectric converting unit are so configured as to receive backward emitted light from said semiconductor laser.

3. The wavelength stabilized laser module according to claim 1, wherein a degree of parallelization of said single parallel luminous flux is within ±2°.

4. The wavelength stabilized laser module according to claim 1, wherein said filter has a transmission characteristic in which transmittance of said filter becomes high or low monotonically depending on wavelengths within a band of wavelengths containing said reference wavelength.

5. The wavelength stabilized laser module according to claim 1, wherein said filter is able to change, by adjusting an angle of incidence, a gradient of changes in transmittance which changes depending on wavelengths.

6. The wavelength stabilized laser module according to claim 1, wherein said filter has a unimodal transmission characteristic in which transmittance of said filter becomes maximum and minimum in a band of wavelengths not containing said reference wavelength.

7. The wavelength stabilized laser module according to claim 1, wherein said filter is a multilayer filter made up of dielectric multilayers formed on a transparent substrate.

8. The wavelength stabilized laser module according to claim 7, wherein said filter is formed on a light receiving surface of said second photoelectric converting unit by a coating method.

9. The wavelength stabilized laser module according to claim 1, wherein said filter is an etalon-type filter exhibiting a transmittance period in which transmittance of said filter becomes maximum and minimum repeatedly at a constant interval of wavelengths.

10. The wavelength stabilized laser module according to claim 9, wherein said semiconductor laser is a wavelength tunable semiconductor laser that is able to emit light having a plurality of wavelengths which change depending on temperatures and said interval of wavelengths in said transmittance period of said etalon-type filter is set by an equation:

$$D = (1 - \text{Tetalon}/\text{TLD}) \times D0 \qquad (1)$$

where said "D" represents said interval of wavelengths in said transmittance period of said etalon-type filter, said "D0" represents an interval of said plurality of wavelengths of light emitted from said semiconductor laser, said "Tetalon" represents an amount of a change in a central wavelength occurring when a temperature of said etalon-type filter changes by 1° C. and said "TLD" represents an amount of a change in an oscillation wavelength occurring when a temperature of said semiconductor laser changes by 1° C., however, said central wavelength represents one wavelength that causes said transmittance to be maximum.

11. The wavelength stabilized laser module according to claim 1, wherein said filter is made up of a transparent material having reflectivity being higher than that of silica glass.

12. The wavelength stabilized laser module according to claim 11, wherein said transparent material is a silicon based material.

13. The wavelength stabilized laser module according to claim 1, wherein said first photoelectric converting unit and said second photoelectric converting unit make up an array-shaped optical detector.

14. The wavelength stabilized laser module according to claim 1, wherein said semiconductor laser has a configuration of a device integrated with an electro-absorption-type semiconductor optical modulator.

15. The wavelength stabilized laser module according to claim 1, wherein said temperature calibrating unit is a Peltier device.

16. The wavelength stabilized laser module according to claim 1, further comprising an optical fiber used as a device through which laser light is output and a single case housing, at least, said semiconductor laser, said temperature calibrating unit, said converting unit for said light conversion to said single parallel luminous flux, said filter and said first photoelectric converting unit and said second photoelectric converting unit.

17. The wavelength stabilized laser module according to claim 1, wherein said one part of said parallel luminous flux and said another part of said parallel luminous flux are apart from each other.

18. The wavelength stabilized laser module according to claim 1, wherein a light receiving surface of said first photoelectric converting unit is placed in a tilt manner relative to an optical axis of incident light.

19. The wavelength stabilized laser module according to claim 1, wherein said first and second photoelectric converting units are placed in parallel on a holding substrate and are both positioned in a tilt manner relative to an optical axis of incident light.

20. A wavelength stabilized laser module, comprising:

a semiconductor laser;

a temperature calibrating unit to calibrate a temperature of said semiconductor laser;

only one lens to arrange light emitted from said semiconductor laser so as to be a single parallel luminous flux;

a first photoelectric converting unit to receive one part of said parallel luminous flux and to convert it to a first electric signal;

a filter to receive another part of said parallel luminous flux and to continuously change its transmittance depending on wavelengths of said light;

a second photoelectric converting unit to receive light transmitted through said filter and to convert it to a second electric signal;

wherein a control signal, to be used for stabilization of wavelengths, obtained by computations of said first electric signal and said second electric signal fed from said first photoelectric converting unit and said second photoelectric converting unit, is fed back to said semiconductor laser and/or said temperature calibrating unit so that said semiconductor laser is able to stably emit laser light having a reference wavelength to be used as a target for stabilization of wavelengths; and wherein said filter is fixed to said second photoelectric converting unit.

* * * * *